(12) United States Patent
Tomura et al.

(10) Patent No.: US 12,707,909 B2
(45) Date of Patent: Aug. 11, 2026

(54) ETCHING METHOD

(71) Applicant: Tokyo Electron Limited, Tokyo (JP)

(72) Inventors: Maju Tomura, Miyagi (JP); Takatoshi Orui, Hillsboro, OR (US); Kae Kumagai, Miyagi (JP); Ryutaro Suda, Miyagi (JP); Satoshi Ohuchida, Miyagi (JP); Yusuke Wako, Miyagi (JP); Yoshihide Kihara, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 240 days.

(21) Appl. No.: 18/140,694

(22) Filed: Apr. 28, 2023

(65) Prior Publication Data

US 2023/0268191 A1 Aug. 24, 2023

Related U.S. Application Data

(63) Continuation-in-part of application No. PCT/JP2021/017012, filed on Apr. 28, 2021.

(51) Int. Cl.

| | |
|---|---|
| ***H10P 50/28*** | (2026.01) |
| ***H01J 37/32*** | (2006.01) |
| ***H10P 50/00*** | (2026.01) |
| ***H10P 50/26*** | (2026.01) |
| ***H10P 76/40*** | (2026.01) |

(52) U.S. Cl.

CPC ...... *H10P 50/283* (2026.01); *H01J 37/32449* (2013.01); *H10P 50/268* (2026.01); *H10P 50/71* (2026.01); *H10P 50/73* (2026.01); *H10P 76/405* (2026.01); *H01J 2237/3341* (2013.01)

(58) Field of Classification Search

None

See application file for complete search history.

(56) References Cited

U.S. PATENT DOCUMENTS

| | | | | |
|---|---|---|---|---|
| 2019/0252203 | A1* | 8/2019 | Gohira | H01L 21/67069 |
| 2020/0263309 | A1* | 8/2020 | Tanaka | H01L 21/31116 |
| 2021/0005472 | A1* | 1/2021 | Kanarik | H01L 21/67109 |
| 2021/0082709 | A1* | 3/2021 | Tomura | H01L 21/6831 |
| 2021/0143016 | A1* | 5/2021 | Yokoyama | H01J 37/32082 |

FOREIGN PATENT DOCUMENTS

| | | | |
|---|---|---|---|
| JP | 60-110122 | A | 6/1985 |
| JP | 2002-524851 | A | 8/2002 |
| JP | 2009-277890 | A | 11/2009 |
| TW | 202046426 | A | 12/2020 |
| WO | 2018/037739 | A1 | 3/2018 |

OTHER PUBLICATIONS

International Search Report and Written Opinion mailed on Jul. 13, 2021, received for PCT Application PCT/JP2021/017012, filed on Apr. 28, 2021, 9 pages including English Translation.

* cited by examiner

*Primary Examiner* — Roberts P Culbert

(74) *Attorney, Agent, or Firm* — XSENSUS LLP

(57) ABSTRACT

An etching method includes (a) providing a substrate in a chamber in a plasma processing apparatus. The substrate includes a silicon-containing film. The etching method further includes (b) etching the silicon-containing film with a chemical species in plasma generated from a process gas in the chamber. The process gas contains a hydrogen fluoride gas and a phosphorus-containing gas.

17 Claims, 16 Drawing Sheets

ETCHING METHOD

CROSS-REFERENCE TO RELATED APPLICATIONS

The present application is a bypass continuation-in-part application of International Application No. PCT/JP2021/017012, filed Apr. 28, 2021, which contains subject matter related to, U.S. Ser. No. 17/666,570, entitled: ETCHING METHOD, filed on Feb. 8, 2022 and U.S. Ser. No. 17/092,376, entitled: SUBSTRATE PROCESSING METHOD AND SUBSTRATE PROCESSING APPARATUS, filed on Nov. 9, 2020, the entire contents of which are incorporated herein by reference.

FIELD

Exemplary embodiments of the present disclosure relate to an etching method, a process gas, and a plasma processing apparatus.

BACKGROUND

Manufacturing electronic devices includes plasma etching of silicon-containing films on substrates. In plasma etching, plasma generated from a process gas is used for etching silicon-containing films. U.S. Patent Application Publication No. 2016/0343580 describes a process gas containing a fluorocarbon gas used for plasma etching of silicon-containing films. Japanese Unexamined Patent Application Publication No. 2016-39310 describes a process gas containing a hydrocarbon gas and a hydrofluorocarbon gas used for plasma etching of silicon-containing films.

CITATION LIST

Patent Literature

Patent Literature 1: U.S. Patent Application Publication No. 2016/0343580

Patent Literature 2: Japanese Unexamined Patent Application Publication No. 2016-39310

BRIEF SUMMARY

Technical Problem

One or more aspects of the present disclosure are directed to a technique for improving the selectivity of a silicon-containing film to a mask in plasma etching.

Solution to Problem

An etching method according to one exemplary embodiment includes (a) providing a substrate in a chamber in a plasma processing apparatus. The substrate includes a silicon-containing film. The etching method further includes (b) etching the silicon-containing film with a chemical species in plasma generated from a process gas in the chamber. The process gas contains a hydrogen fluoride gas and a phosphorus-containing gas.

Advantageous Effects

The technique according to one exemplary embodiment improves the selectivity of a silicon-containing film to a mask in plasma etching.

DETAILED DESCRIPTION

Figure 1:
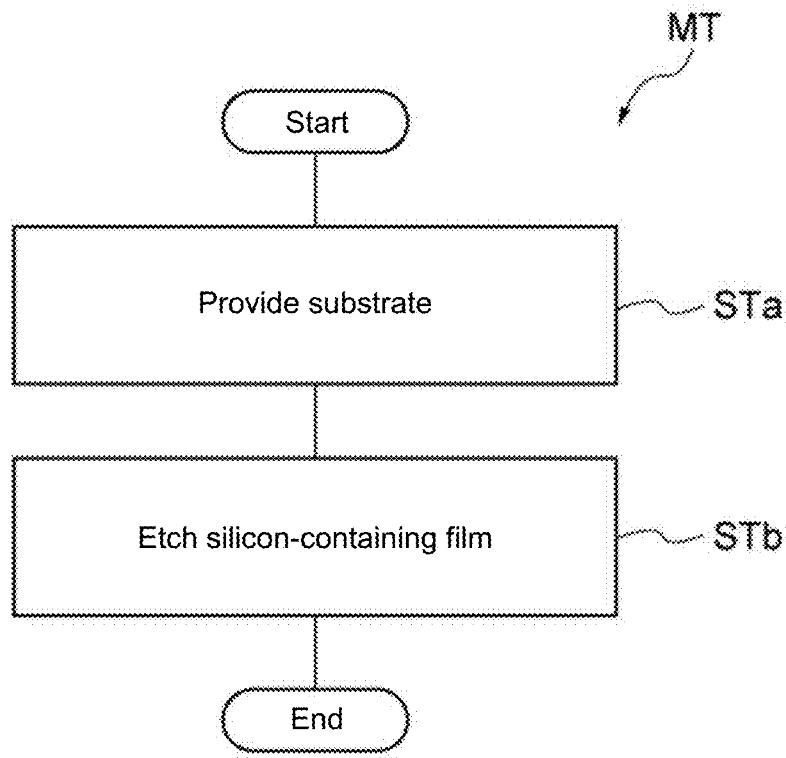
FIG. 1 is a flowchart of an etching method according to one exemplary embodiment.

Exemplary embodiments will now be described.

An etching method according to one exemplary embodiment includes (a) providing a substrate in a chamber in a plasma processing apparatus. The substrate includes a silicon-containing film. The etching method further includes (b) etching the silicon-containing film with a chemical species in plasma generated from a process gas in the chamber. The process gas contains a hydrogen fluoride gas and a phosphorus-containing gas.

In the above embodiment, an etchant generated from hydrogen fluoride has small mass but has high performance in etching of the silicon-containing film. The above embodiment thus improves the selectivity of the silicon-containing film to the mask in etching.

In one exemplary embodiment, the process gas may further contain a halogen-containing gas.

The halogen-containing gas may contain at least one gas selected from the group consisting of a $Cl_2$ gas, a $Br_2$ gas, an HCl gas, an HBr gas, an HI gas, a $BCl_3$ gas, a $C_xH_yCl_z$ gas, a $C_xF_yBr_z$ gas, a $C_xF_yI_z$ gas, a $C_xF_yCl_z$ gas, a $ClF_3$ gas, an $IF_5$ gas, an $IF_7$ gas, and a $BrF_3$ gas, where x and z are integers greater than or equal to 1, and y is an integer greater than or equal to 0.

In one exemplary embodiment, the halogen-containing gas may contain carbon. The halogen-containing gas may contain carbon and two or more halogens. The halogen-containing gas may contain at least one selected from the group consisting of a $CHCl_3$ gas, a $CH_2Cl_2$ gas, a $CF_2Br_2$ gas, and a $C_xF_yCl_z$ gas, where x and z are integers greater than or equal to 1, and y is an integer greater than or equal to 0.

In one exemplary embodiment, the process gas may further contain a carbon-containing gas. A carbon chemical species generated from the carbon-containing gas accumulates on the mask and protects the mask, improving the selectivity of the silicon-containing film to the mask in etching.

In one exemplary embodiment, the carbon-containing gas may contain at least one of a fluorocarbon or a hydrofluorocarbon having one to six carbon atoms per molecule.

In one exemplary embodiment, the process gas may further contain at least one gas selected from the group consisting of an $NF_3$ gas, an $O_2$ gas, a $CO_2$ gas, a CO gas, an $N_2$ gas, a He gas, an Ar gas, a Kr gas, and a Xe gas.

In one exemplary embodiment, the hydrogen fluoride gas may have a highest flow rate of all gases in the process gas containing no noble gas. In some embodiments, the hydrogen fluoride gas may have a highest flow rate of all non-noble gas components of the process gas.

In one exemplary embodiment, (b) may include decreasing a flow rate of the carbon-containing gas in a stepwise manner. In one exemplary embodiment, (b) may include setting a pressure in the chamber to 0.666 to 2.666 Pa inclusive. In one exemplary embodiment, (b) may include decreasing a pressure in the chamber in a stepwise manner.

In one exemplary embodiment, the silicon-containing film may include at least one of a silicon oxide film or a silicon nitride film. The silicon-containing film may further include a polycrystalline silicon film. In one exemplary embodiment, the substrate may include a carbon-containing mask or a metal-containing mask on the silicon-containing film. In one exemplary embodiment, the substrate may include a mask containing at least one metal-containing material selected from the group consisting of titanium nitride, titanium oxide, tungsten, and tungsten carbide on the silicon-containing film.

An etching method according to one exemplary embodiment includes (a) providing a substrate in a chamber in a plasma processing apparatus. The substrate includes a silicon-containing film. The etching method further includes (b) etching the silicon-containing film with a chemical species in plasma generated from a process gas in the chamber. The process gas contains a gas for generating hydrogen fluoride and a phosphorus-containing gas or contains a gas for generating hydrogen fluoride and an amine gas.

In one exemplary embodiment, the process gas may further contain a halogen-containing gas.

A plasma processing apparatus according to one exemplary embodiment includes a chamber, a substrate support in the chamber, a plasma generator, and a controller. The controller performs plasma processing. The plasma processing includes (a) placing a substrate on the substrate support. The substrate includes a silicon-containing film. The plasma processing further includes (b) etching the silicon-containing film with a chemical species in plasma generated from a process gas in the chamber. The process gas contains a gas for generating a hydrogen fluoride species and a phosphorus-containing gas.

One or more exemplary embodiments will now be described in detail with reference to the drawings. In the figures, the same or corresponding components are given the same reference numerals.

FIG. 1 is a flowchart of an etching method according to one exemplary embodiment. The etching method shown in FIG. 1 (hereinafter referred to as the method MT) is used for a substrate including a silicon-containing film. The silicon-containing film is etched with the method MT.

Figure 2:
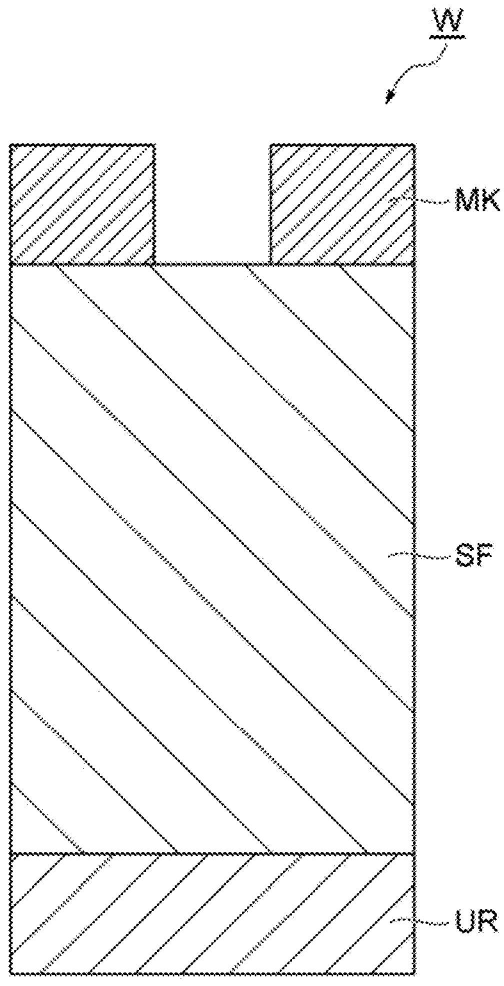
FIG. 2 is a partially enlarged cross-sectional view of an example substrate to be processed with the etching method shown in FIG. 1.

FIG. 2 is a partially enlarged cross-sectional view of an example substrate to be processed with the etching method shown in FIG. 1. A substrate W shown in FIG. 2 can be used for manufacturing devices such as a dynamic random-access memory (DRAM) and a 3D-NAND. The substrate W includes a film SF and a mask MK. The substrate W may further include an underlying region UR. The film SF may be located on the underlying region UR. The mask MK is on the film SF.

The film SF is a silicon-containing film. In other words, the film SF contains silicon. The film SF may be a single layer or a multilayer. The film SF being a single layer is a silicon oxide film, a silicon nitride film, a silicon film such as a polycrystalline silicon film, a carbon-containing silicon film such as a SiC film, or a low dielectric constant film. The low dielectric constant film is used as, for example, an interlayer insulating film, and is formed from, for example, SiOC, SiOF, or SiCOH. The film SF being a multilayer includes at least one of a silicon oxide film or a silicon nitride film. The film SF being a multilayer may further include a polycrystalline silicon film. The film SF may include an alternate stack of multiple silicon oxide films and multiple silicon nitride films. The film SF may include an alternate stack of multiple silicon oxide films and multiple silicon films (e.g., polycrystalline silicon films). The film SF may include a silicon oxide film, a silicon nitride film, and a polycrystalline silicon film.

The mask MK is formed from a material having a lower etching rate than the film SF in step STb. The mask MK may be formed from an organic material. More specifically, the mask MK may be a carbon-containing mask. The mask MK may be formed from, for example, an amorphous carbon film, a photoresist film, a spin-on-carbon (SOC) film, or a boron carbide film. In some embodiments, the mask MK may be formed from a silicon-containing film such as a silicon-containing antireflective film. In some embodiments, the mask MK may be a metal-containing mask formed from a metal-containing material containing a metal such as titanium, tungsten, molybdenum, or ruthenium. The mask MK may contain, for example, titanium nitride or titanium oxide. The mask MK may contain, for example, tungsten. The mask MK may contain, for example, tungsten and at least one selected from the group consisting of silicon, carbon, and titanium. The mask MK may contain tungsten carbide (WC) or at least one selected from the group consisting of tungsten silicide (WSi), tungsten silicon nitride (WSiN), and tungsten silicon carbide (WSiC). The mask MK may have a thickness of 3 μm or more.

The mask MK is patterned. More specifically, the mask MK has a pattern to be transferred onto the film SF in step STb. With the pattern of the mask MK transferred onto the film SF, the film SF has a recess such as a hole or a trench. The recess in the film SF formed in step STb may have an aspect ratio of 20 or more, or 30, 40, or 50 or more. The mask MK may have a line-and-space pattern.

Figure 3:
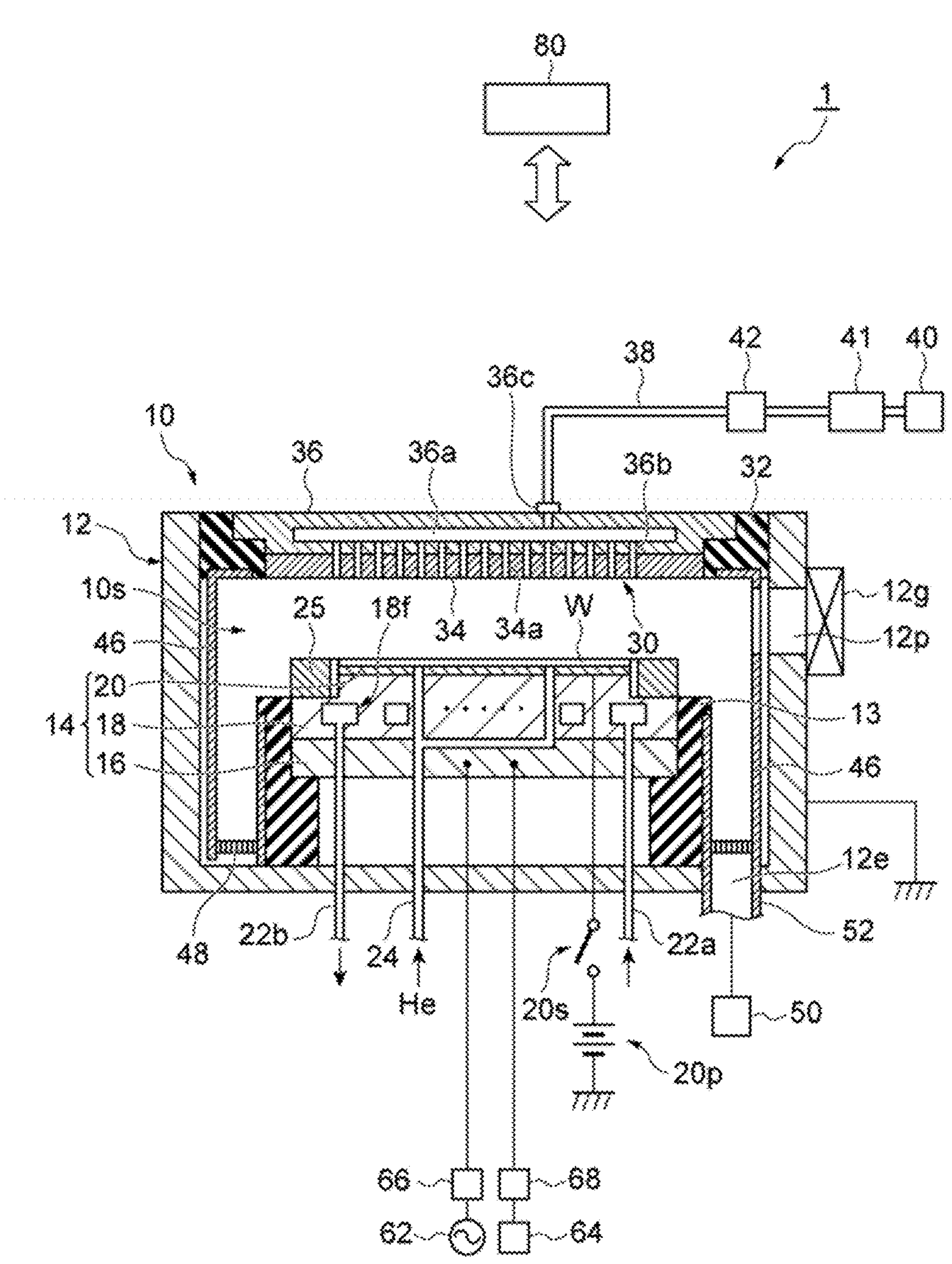
FIG. 3 is a schematic diagram of a plasma processing apparatus according to one exemplary embodiment.

The method MT is used by a plasma processing apparatus for etching the film SF. FIG. 3 is a schematic diagram of a plasma processing apparatus according to one exemplary embodiment. A plasma processing apparatus 1 shown in FIG. 3 includes a chamber 10. The chamber 10 has an internal space 10*s*. The chamber 10 includes a chamber body 12 that is substantially cylindrical. The chamber body 12 is formed from, for example, aluminum. The chamber body 12 has an inner wall coated with an anticorrosive film. The anticorrosive film may be a film of ceramic such as aluminum oxide or yttrium oxide.

The chamber body 12 has a side wall having a port 12*p*. A substrate W is transferred between the internal space 10*s* and the outside of the chamber 10 through the port 12*p*. The port 12*p* is open and closed by a gate valve 12*g*. The gate valve 12*g* is on the side wall of the chamber body 12.

A support 13 is located on the bottom of the chamber body 12. The support 13 is formed from an insulating material. The support 13 is substantially cylindrical. The support 13 extends upward from the bottom of the chamber body 12 into the internal space 10*s*. The support 13 supports a substrate support 14. The substrate support 14 supports the substrate W in the internal space 10*s*.

The substrate support 14 includes a lower electrode 18 and an electrostatic chuck (ESC) 20. The substrate support 14 may further include an electrode plate 16. The electrode plate 16 is substantially disk-shaped and is formed from a conductor such as aluminum. The lower electrode 18 is on the electrode plate 16. The lower electrode 18 is substantially disk-shaped and is formed from a conductor such as aluminum. The lower electrode 18 is electrically coupled to the electrode plate 16.

The ESC 20 is on the lower electrode 18. The substrate W is placed on the upper surface of the ESC 20. The ESC 20 includes a body and an electrode. The body of the ESC 20 is substantially disk-shaped and is formed from a dielectric. In the ESC 20, the electrode is a film electrode located in the body. The electrode in the ESC 20 is coupled to a direct-current (DC) power supply 20*p* through a switch 20*s*. A voltage is applied from the DC power supply 20*p* to the electrode in the ESC 20 to generate an electrostatic attraction between the ESC 20 and the substrate W. The substrate W is attracted to and held by the ESC 20 under the generated electrostatic attraction.

An edge ring 25 is placed on the substrate support 14. The edge ring 25 is annular. The edge ring 25 may be formed from silicon, silicon carbide, or quartz. The substrate W is placed in an area on the ESC 20 surrounded by the edge ring 25.

The lower electrode 18 has an internal channel 18*f* for carrying a heat-exchange medium (e.g., a refrigerant) being supplied through a pipe 22*a* from a chiller unit external to the chamber 10. The heat-exchange medium supplied to the channel 18*f* returns to the chiller unit through a pipe 22*b*. In the plasma processing apparatus 1, the temperature of the substrate W on the ESC 20 is adjusted through heat exchange between the heat-exchange medium and the lower electrode 18.

The plasma processing apparatus 1 includes a gas supply line 24. The gas supply line 24 supplies a heat-transfer gas (e.g., a He gas) from a heat-transfer gas supply assembly into a space between the upper surface of the ESC 20 and the back surface of the substrate W.

The plasma processing apparatus 1 further includes an upper electrode 30. The upper electrode 30 is located above the substrate support 14. The upper electrode 30 is supported in an upper portion of the chamber body 12 with a member 32. The member 32 is formed from an insulating material. The upper electrode 30 and the member 32 close a top opening of the chamber body 12.

The upper electrode 30 may include a ceiling plate 34 and a support member 36. The ceiling plate 34 has its lower surface exposed to and defining the internal space 10*s*. The ceiling plate 34 may be formed from a low resistance conductor or a semiconductor that generates less Joule heat. The ceiling plate 34 has multiple gas outlet holes 34*a* that are through-holes in the thickness direction.

The support member 36 supports the ceiling plate 34 in a detachable manner. The support member 36 is formed from a conductive material such as aluminum. The support member 36 has an internal gas-diffusion compartment 36*a*. The support member 36 has multiple gas holes 36*b* that extend downward from the gas-diffusion compartment 36*a*. The gas holes 36*b* communicate with the respective gas outlet holes 34*a*. The support member 36 has a gas inlet 36*c*. The gas inlet 36*c* is connected to the gas-diffusion compartment 36*a*. The gas inlet 36*c* is also connected to a gas supply pipe 38.

The gas supply pipe 38 is connected to a set of gas sources 40 through a set of flow controllers 41 and a set of valves 42. The flow controller set 41 and the valve set 42 are included in a gas supply unit. The gas supply unit may further include the gas source set 40. The gas source set 40 includes multiple gas sources. The gas sources include the sources of the process gas used with a method MT. The flow controller set 41 includes multiple flow controllers. The flow controllers in the flow controller set 41 are mass flow controllers or pressure-based flow controllers. The valve set 42 includes multiple open-close valves. The gas sources in the gas source set 40 are connected to the gas supply pipe 38 through the respective flow controllers in the flow controller set 41 and through the respective open-close valves in the valve set 42.

The plasma processing apparatus 1 includes a shield 46 along the inner wall of the chamber body 12 and along the periphery of the support 13 in a detachable manner. The shield 46 prevents a reaction product from accumulating on the chamber body 12. The shield 46 includes, for example, an aluminum base coated with an anticorrosive film. The anticorrosive film may be a film of ceramic such as yttrium oxide.

A baffle plate 48 is located between the support 13 and the side wall of the chamber body 12. The baffle plate 48 includes, for example, an aluminum member coated with an anticorrosive film (e.g., an yttrium oxide film). The baffle plate 48 has multiple through-holes. The chamber body 12 has an outlet 12*e* in its bottom below the baffle plate 48. The outlet 12*e* is connected to an exhaust device 50 through an exhaust pipe 52. The exhaust device 50 includes a pressure control valve and a vacuum pump such as a turbomolecular pump.

The plasma processing apparatus 1 includes a radio-frequency (RF) power supply 62 and a bias power supply 64. The RF power supply 62 generates RF power HF. The RF power HF has a first frequency suitable for generating plasma. The first frequency ranges from, for example, 27 to 100 MHz. The RF power supply 62 is coupled to the lower electrode 18 through an impedance matching circuit, or matcher 66, and through the electrode plate 16. The matcher 66 includes a circuit for matching the impedance of a load (the lower electrode 18) for the RF power supply 62 and the output impedance of the RF power supply 62. The RF power supply 62 may be coupled to the upper electrode 30 through the matcher 66. The RF power supply 62 serves as an exemplary plasma generator.

The bias power supply 64 generates an electrical bias. The bias power supply 64 is electrically coupled to the lower electrode 18. The electrical bias has a second frequency lower than the first frequency. The second frequency ranges from, for example, 400 kHz to 13.56 MHz. When used in addition to the RF power HF, the electrical bias is applied to the substrate support 14 (e.g., the lower electrode 18) to draw ions toward the substrate W. The electrical bias applied to the lower electrode 18 changes the potential of the substrate W on the substrate support 14 in periods defined by the second frequency. The electrical bias may be applied to an electrode other than the lower electrode 18 in the substrate support 14, or specifically, an electrode located in the ESC 20.

In one embodiment, the electrical bias may be RF power LF with the second frequency. When used in addition to the RF power HF, the RF power LF serves as RF bias power for drawing ions toward the substrate W. The bias power supply 64 that generates RF power LF is coupled to the lower electrode 18 through an impedance matching circuit, or matcher 68, and through the electrode plate 16. The matcher 68 includes a circuit for matching the impedance of a load (the lower electrode 18) for the bias power supply 64 and the output impedance of the bias power supply 64.

The RF power LF alone may be used to generate plasma, without the RF power HF being used. In other words, a single RF power may be used to generate plasma. In this case, the RF power LF may have a frequency higher than 13.56 MHz, or for example, 40 MHz. In this case, the plasma processing apparatus 1 may not include the RF power supply 62 and the matcher 66. The bias power supply 64 serves as an exemplary plasma generator.

In another embodiment, the electrical bias may be a pulsed voltage. The pulsed voltage occurs periodically and is applied to the lower electrode 18. The pulsed voltage occurs in periods defined by the second frequency. More specifically, the duration of the period of the pulsed voltage is the inverse of the second frequency. The pulsed voltage may be a pulsed DC voltage. Each period of the pulsed DC voltage includes two periods. The DC voltage in one of the two periods is, for example, a negative DC voltage that sets the substrate W to a negative potential in the period. The DC voltage has a higher level (a greater absolute value) in one period than in the other period. The DC voltage may be negative or positive in the other period. The DC voltage in the other period may have a level higher than zero or a level of zero. In this embodiment, the bias power supply 64 is coupled to the lower electrode 18 through a low-pass filter and through the electrode plate 16. The pulse wave used as an electrical bias may include a pulsed voltage with a waveform other than a DC waveform. The pulse wave used as an electrical bias may include a square wave pulse, a triangular wave pulse, an impulse, or any other waveform pulse. When the pulse wave includes a positive voltage and a negative voltage, the bias power supply 64 may be formed from one or more power supplies.

In one embodiment, the bias power supply 64 may apply a continuous-wave electrical bias to the lower electrode 18. In other words, the bias power supply 64 may continuously apply the electrical bias to the lower electrode 18. The continuous-wave electrical bias may be applied to the lower electrode 18 during the processing in step STb of the method MT.

In some embodiments, the bias power supply 64 may apply a pulsed electrical bias to the lower electrode 18. The pulsed electrical bias may be periodically applied to the lower electrode 18. The pulsed electrical bias occurs in periods defined by a third frequency. More specifically, the period of the pulsed electrical bias is the inverse of the third frequency. The third frequency is lower than the second frequency. The third frequency ranges from, for example, 1 Hz to 200 kHz inclusive. In some embodiments, the third frequency may range from 5 Hz to 100 kHz inclusive.

Each period of the pulsed electrical bias includes two periods, or specifically, a period H and a period L. The electrical bias has a higher level (or a higher level of the pulsed electrical bias) in the period H than in the period L. In other words, the level of the electrical bias may be increased or decreased to apply a pulsed electrical bias to the lower electrode 18. The electrical bias may have a level higher than zero in the period L. In some embodiments, the electrical bias may have a level of zero in the period L. In other words, the pulsed electrical bias may be applied to the lower electrode 18 by repeatedly turning on and off the electrical bias applied to the lower electrode 18. When the electrical bias is RF power LF, the power level of the electrical bias is the same level as the power level of the RF power LF. The RF power LF used as the pulsed electrical bias has a level of 2 kW or more. When the electrical bias is a pulsed negative DC voltage, the power level of the electrical bias is a level equivalent to the effective value of the absolute value of the negative DC voltage. The duty ratio of the pulsed electrical bias, or the ratio of the period H to the period of the pulsed electrical bias, ranges from, for example, 1 to 80% inclusive. In some embodiments, the duty ratio of the pulsed electrical bias may range from 5 to 50% inclusive or 50 to 99% inclusive. The pulsed electrical bias may be applied to the lower electrode 18 to perform step STb of the method MT.

In one embodiment, the RF power supply 62 may provide continuous-wave RF power HF. In other words, the RF power supply 62 may continuously provide the RF power HF. The continuous-wave RF power HF may be provided during the processing in step STb of the method MT.

In some embodiments, the RF power supply 62 may provide pulsed-RF power HF. The pulsed-RF power HF may be provided periodically. The pulsed-RF power HF occurs in periods defined by a fourth frequency. More specifically, the period of the pulsed-RF power HF is the inverse of the fourth frequency. The fourth frequency is lower than the second frequency. In one embodiment, the fourth frequency is the same as the third frequency. Each period of the pulsed-RF power HF includes two periods, or specifically, a period H and a period L. The RF power HF has a higher power level in the period H than in the other period, or the period L. The RF power HF may have a power level higher than zero or a power level of zero in the period L.

The periods of the pulsed-RF power HF may be synchronized with the periods of the pulsed electrical bias. The periods H of the pulsed-RF power HF may be synchronized with the periods H of the pulsed electrical bias. In some embodiments, the periods H of the pulsed-RF power HF may not be synchronized with the periods H of the pulsed electrical bias. The periods H of the pulsed-RF power HF may have the same durations as or may have durations different from the periods H of the pulsed electrical bias.

The gas supply unit supplies a gas into the internal space 10*s* for plasma processing in the plasma processing apparatus 1. The RF power HF, the electrical bias, or both are provided to form an RF electric field between the upper electrode 30 and the lower electrode 18. The resultant RF electric field generates plasma from the gas in the internal space 10*s*.

The plasma processing apparatus 1 may further include a controller 80. The controller 80 may be a computer including a processor, a storage such as a memory, an input device, a display, and an input-output interface for signals. The controller 80 controls the components of the plasma processing apparatus 1. An operator can use the input device in the controller 80 to input a command or perform other operations for managing the plasma processing apparatus 1. The display in the controller 80 can display and visualize the operating state of the plasma processing apparatus 1. The storage stores control programs and recipe data. The control program is executed by the processor to perform the processing in the plasma processing apparatus 1. The processor executes the control program to control the components of the plasma processing apparatus 1 in accordance with the recipe data.

Referring back to FIG. 1, the method MT used by the plasma processing apparatus 1 to process the substrate W shown in FIG. 2 will now be described by way of example. The components of the plasma processing apparatus 1 are controlled by the controller 80 to allow the plasma processing apparatus 1 to implement the method MT. The control by the controller 80 over the components of the plasma processing apparatus 1 to implement the method MT will also be described below.

Figure 4:
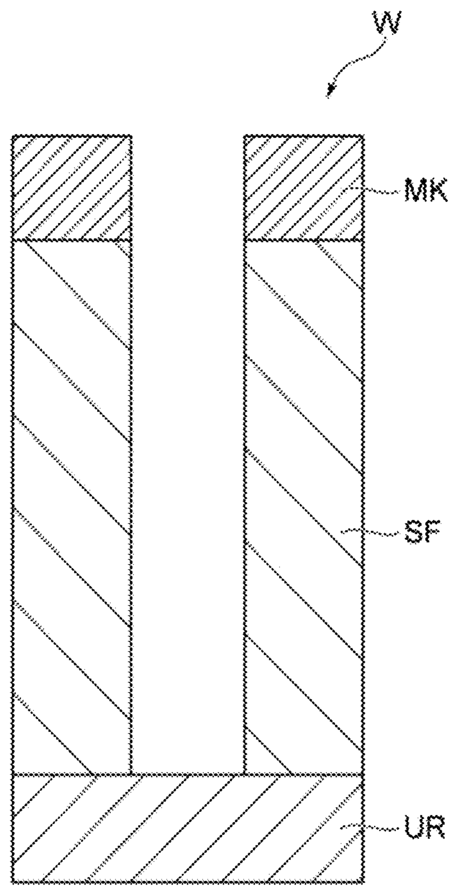
FIG. 4 is a partially enlarged cross-sectional view of an example substrate processed with the etching method shown in FIG. 1.

FIG. 4 will be referred to, in addition to FIG. 1. FIG. 4 is a partially enlarged cross-sectional view of an example substrate processed with the etching method shown in FIG. 1.

As shown in FIG. 1, the method MT starts from step STa. In step STa, the substrate W is provided in the chamber 10. The substrate W is placed onto and held by the ESC 20 in the chamber 10. The substrate W may have a diameter of 300 mm.

The method MT includes step STb to be performed next. In step STb, plasma is generated from a process gas in the chamber 10. In step STb, the film SF is etched with a chemical species contained in the plasma. As shown in FIG. 4, the film SF may be etched in step STb until the underlying region UR is exposed.

The process gas used in step STb contains a hydrogen fluoride (HF) gas as an etchant gas. The etchant generated from HF has small mass but has high performance in etching of the film SF. The film SF thus has higher selectivity to the mask MK in etching.

The process gas may contain, instead of part or all of the HF gas, a gas for generating an HF species in plasma. The HF species include at least any of an HF gas, radicals, or ions.

The gas for generating an HF species may be, for example, a hydrofluorocarbon gas. The hydrofluorocarbon gas may have at least two, three, or four carbon atoms. In one example, the hydrofluorocarbon gas is at least one selected from the group consisting of a $CH_2F_2$ gas, a $C_3H_2F_4$ gas, a $C_3H_2F_6$ gas, a $C_3H_3F_5$ gas, a $C_4H_2F_6$ gas, a $C_4H_5F_5$ gas, a $C_4H_2F_8$ gas, a $C_5H_2F_6$ gas, a $C_5H_2F_{10}$ gas, and a $C_5H_3F_7$ gas. In one example, the hydrofluorocarbon gas is at least one selected from the group consisting of a $CH_2F_2$ gas, a $C_3H_2F_4$ gas, a $C_3H_2F_6$ gas, and a $C_4H_2F_6$ gas.

The gas for generating an HF species may be, for example, a mixture containing a hydrogen source and a fluorine source. The hydrogen source may be at least one selected from the group consisting of an $H_2$ gas, an $NH_3$ gas, an $H_2O$ gas, an $H_2O_2$ gas, and a hydrocarbon gas (e.g., a $CH_4$ gas or a $C_3H_6$ gas). The fluorine source may be a carbon-free fluorine-containing gas, such as an $NF_3$ gas, an $SF_6$ gas, a $WF_6$ gas, or an $XeF_2$ gas. The fluorine source may be a carbon-containing fluorine-containing gas, such as a fluorocarbon gas or a hydrofluorocarbon gas. In one example, the fluorocarbon gas may be at least one selected from the group consisting of a $CF_4$ gas, a $C_2F_2$ gas, a $C_2F_4$ gas, a $C_3F_6$ gas, a $C_3F_5$ gas, a $C_4F_6$ gas, a $C_4F_8$ gas, and a $C_5F_8$ gas. In one example, the hydrofluorocarbon gas is at least one selected from the group consisting of a $CHF_3$ gas, a $CH_2F_2$ gas, a $CH_3F$ gas, a $C_2HF_5$ gas, and a hydrofluorocarbon gas containing at least three carbon atoms (e.g., a $C_3H_2F_4$ gas, a $C_3H_2F_6$ gas, or a $C_4H_2F_6$ gas).

In step STb, the process gas may or may not contain a noble gas. The HF gas in the process gas containing no noble gas has the highest flow rate of all gases in the process gas. In some embodiments, the HF gas in the process gas has the highest flow rate of all non-noble gas components of the process gas.

More specifically, in step STb, the HF gas may have a flow rate greater than or equal to 70, 80, 85, 90, or 95 vol % of the total flow rate of the process gas containing no noble gas or of the non-noble gas components of the process gas. For the process gas further containing another gas such as a carbon-containing gas, the HF gas may have a flow rate less than 100 vol %, or less than or equal to 99.5, 98, or 96 vol % of the total flow rate of the process gas containing no noble gas or of the non-noble gas components of the process gas.

In one example, the HF gas is controlled to have a flow rate of 70 to 96 vol % of the total flow rate of the process gas containing no noble gas or of the non-noble gas components of the process gas. The flow rate of the HF gas in the process gas is controlled within the above range to allow etching of the film SF at a higher etching rate while causing less etching of the mask MK. For example, the film SF has the high selectivity of 5 or greater to the mask MK in etching. The method MT thus allows etching of the film SF at an effective rate in processes, such as in manufacturing processes for a NAND flash memory with a three-dimensional structure, to achieve a high aspect ratio. Such high selectivity allows addition of a smaller amount of a deposition gas such as a carbon-containing gas. This reduces the likelihood of openings in the mask MK being clogged.

The process gas used in step STb may further contain a carbon-containing gas. A carbon chemical species generated from the carbon-containing gas accumulates on the mask MK to protect the mask. This further improves the selectivity of the film SF to the mask MK in etching.

The carbon-containing gas contains, for example, at least one selected from the group consisting of a hydrocarbon ($C_xH_y$) gas, a fluorocarbon ($C_vF_w$) gas, and a hydrofluorocarbon ($C_sH_tF_u$) gas, where x, y, s, t, u, v, and w are integers greater than or equal to 1. The carbon-containing gas may contain a fluorocarbon, a hydrofluorocarbon, or both having one to six carbon atoms per molecule. A carbon-containing gas having two or more carbon atoms per molecule may further improve protection of a side wall surface defining the recess in the mask MK and the film SF. A hydrofluorocarbon gas generates HF, and thus increases the etching rate of the film SF in addition to protecting the mask MK with a carbon-containing substance.

The fluorocarbon gas may be, for example, at least one selected from the group consisting of a $CF_4$ gas, a $C_2F_2$ gas, a $C_2F_4$ gas, a $C_3F_8$ gas, a $C_4F_6$ gas, a $C_4F_8$ gas, and a $C_5F_8$ gas. The hydrofluorocarbon gas may be, for example, at least one selected from the group consisting of a $CHF_3$ gas, a $CH_2F_2$ gas, a $CH_3F$ gas, a $C_2HF_5$ gas, a $C_2H_2F_4$ gas, a $C_2H_3F_3$ gas, a $C_2H_4F_2$ gas, a $C_3HF_7$ gas, a $C_3H_2F_2$ gas, a $C_3H_2F_6$ gas, a $C_3H_2F_4$ gas, a $C_3H_3F_5$ gas, a $C_4H_5F_5$ gas, a $C_4H_2F_6$ gas, a $C_5H_2F_{10}$ gas, a c-$C_5H_3F_7$ gas, and a $C_3H_2F_4$ gas. The hydrocarbon gas may be, for example, at least one selected from the group consisting of a $CH_4$ gas, a $C_2H_6$ gas, a $C_3H_6$ gas, a $C_3H_8$ gas, and a $C_4H_{10}$ gas.

In one example, the carbon-containing gas may be a gas of fluorocarbon having two or more carbon atoms, a gas of hydrofluorocarbon having two or more carbon atoms, or both the gases. The gas of fluorocarbon having two or more carbon atoms, the gas of hydrofluorocarbon having two or more carbon atoms, or both the gases can effectively reduce feature failures, such as bowing. A gas of fluorocarbon having three or more carbon atoms, a gas of hydrofluorocarbon having three or more carbon atoms, or both the gases can further reduce feature failures. The gas of fluorocarbon having three or more carbon atoms may be, for example, $C_4F_8$ or $C_4F_6$. The gas of hydrofluorocarbon having three or more carbon atoms may have an unsaturated bond and may contain one or more $CF_3$ groups. The gas of hydrofluorocarbon having three or more carbon atoms may be, for example, $C_3H_2F_4$, $C_3H_2F_6$, or $C_4H_2F_6$.

The process gas used in step STb may contain a phosphorus-containing gas or an amine gas such as an $NH_3$ gas. With a phosphorus chemical species or an amine chemical species on the substrate W, the etchant is supplied more to the bottom of the recess. This increases the etching rate of the film SF and improves the resultant selectivity of the film SF to the mask MK in etching. The phosphorus chemical species generated from the phosphorus-containing gas also protects the side wall defining the recess in the mask MK and in the film SF.

The phosphorus-containing gas contains at least one phosphorus-containing molecule. The phosphorus-containing gas may contain an oxide such as tetraphosphorus decaoxide ($P_4O_{10}$), tetraphosphorus octoxide ($P_4O_8$), or tetraphosphorus hexaoxide ($P_4O_6$). Tetraphosphorus decaoxide may also be called diphosphorus pentaoxide ($P_2O_5$). The phosphorus-containing gas may contain a halide such as phosphorus trifluoride ($PF_3$), phosphorus pentafluoride ($PF_5$), phosphorus trichloride ($PCl_3$), phosphorus pentachloride ($PCl_5$), phosphorus tribromide ($PBr_3$), phosphorus pentabromide ($PBr_5$), or phosphorus iodide ($PI_3$). In other words, the phosphorus-containing gas may contain fluorine as a halogen or non-fluorine halogen. The phosphorus-containing gas may contain a phosphoryl halide such as phosphoryl fluoride ($POF_3$), phosphorus oxychloride ($POCl_3$), or phosphoryl bromide ($POBr_3$). The phosphorus-containing gas may contain phosphine ($PH_3$), calcium phosphide (e.g., $Ca_3P_2$), phosphoric acid ($H_3PO_4$), sodium phosphate ($Na_3PO_4$), or hexafluorophosphoric acid ($HPF_6$). The phosphorus-containing gas may contain a fluorophosphine ($H_xPF_y$), where the sum of x and y is 3 or 5. The phosphorus-containing gas may be phosphorus fluoride. An example of phosphorus fluoride may include $PF_3$ or $PF_5$. The fluorophosphine may be, for example, $HPF_2$ or $H_2PF_3$. The process gas may contain at least one phosphorus-containing molecule selected from the above phosphorus-containing molecules. The process gas may contain, for example, at least one phosphorus-containing gas selected from the group consisting of a $PF_3$ gas, a $PCl_3$ gas, a $PF_5$ gas, a $PCl_5$ gas, a $POCl_3$ gas, a $PH_3$ gas, a $PBr_3$ gas, and a $PBr_5$ gas. Each phosphorus-containing molecule contained in the process gas in either liquid or solid form may be vaporized by, for example, heating before being supplied into the chamber 10.

The process gas used in step STb may contain at least one gas selected from the group consisting of an $NF_3$ gas, an $O_2$ gas, a $CO_2$ gas, a CO gas, an $N_2$ gas, a He gas, an Ar gas, a Kr gas, and a Xe gas. The chemical species generated from these gases may reduce the likelihood of the openings in the mask MK being clogged, or increase the verticality of the side wall of the mask MK.

The process gas used in step STb may contain an oxygen-containing gas. The oxygen-containing gas may contain at least one selected from the group consisting of an $O_2$ gas, a CO gas, a $CO_2$ gas, an $H_2O$ gas, and an $H_2O_2$ gas.

The process gas used in step STb may contain a halogen-containing gas. The halogen-containing gas reduces bowing of the side wall of the film SF.

The halogen-containing gas in the process gas used in step STb may or may not contain carbon. In one exemplary embodiment, the halogen-containing gas may be a gas containing carbon and one or more halogens, or a gas containing carbon and two or more halogens. In one exemplary embodiment, the halogen-containing gas may also contain at least one selected from the group consisting of a carbon-free fluorine-containing gas, a chlorine-containing gas, a bromine-containing gas, and an iodine-containing gas.

The carbon-free fluorine-containing gas may contain, for example, at least one selected from the group consisting of an $SF_6$ gas, an $NF_3$ gas, an $XeF_2$ gas, an $SiF_4$ gas, an $IF_7$ gas, a $ClF_5$ gas, a $BrF_5$ gas, an $AsF_5$ gas, an $NF_5$ gas, a $PF_3$ gas, a $PF_5$ gas, a $POF_3$ gas, a $BF_3$ gas, an $HPF_6$ gas, and a $WF_6$ gas.

The chlorine-containing gas contains, for example, at least one selected from the group consisting of a $Cl_2$ gas, an HCl gas, a $C_xH_yCl_z$ gas, a $ClF_3$ gas, an $SiCl_2$ gas, an $SiCl_4$ gas, a $BCl_3$ gas, a $PCl_3$ gas, a $PCl_5$ gas, and a $POCl_3$ gas, where x and z are integers greater than or equal to 1, and y is an integer greater than or equal to 0. $C_xH_yCl_z$ is, for example, $CCl_4$, $CH_2Cl_2$, or $CHCl_3$. The chlorine-containing gas may also contain a halogen other than chlorine. In other words, the chlorine-containing gas may contain $C_xH_yCl_zX_w$, where X is a halogen other than chlorine, x, z, and w are integers greater than or equal to 1, and y is an integer greater than or equal to 0. A halogen other than chlorine may be, for example, fluorine. In other words, the chlorine-containing gas may be $C_xH_yF_zCl_w$, where x, z, and w are integers greater than or equal to 1, and y is an integer greater than or equal to 0. In some embodiments, the chlorine-containing gas may be $C_xF_yCl_z$, where x and z are integers greater than or equal to 1, and y is an integer greater than or equal to 0. The chlorine-containing gas may contain, for example, at least one selected from the group consisting of a $CF_2Cl_2$ gas, a $CH_2ClF$ gas, and a $CHCl_2F$ gas.

The bromine-containing gas contains at least one gas selected from the group consisting of a $Br_2$ gas, an HBr gas, a $BrF_3$ gas, a $C_xF_yBr_z$ gas, a $PBr_3$ gas, a $PBr_5$ gas, a $POBr_3$ gas, where x and z are integers greater than or equal to 1, and y is an integer greater than or equal to 0. $C_xF_yBr_z$ is, for example, $CBr_2F_2$ or $C_2F_5Br$.

The iodine-containing gas may contain at least one selected from the group consisting of an HI gas, an $IF_t$ gas, a $C_xF_yI_z$ gas, an $I_2$ gas, and a $PI_3$ gas, where t is an integer greater than or equal to 1, x and z are integers greater than or equal to 1, and y is an integer greater than or equal to 0. $IF_t$ is, for example, $IF_5$ or $IF_7$. $C_xF_yI_z$ is, for example, $CF_3I$, $C_2F_5I$, or $C_3F_7I$. The iodine-containing gas is, for example, a $CF_3I$ gas. In addition to protecting the side wall of the recess, the iodine-containing gas may improve the verticality of the side wall surface of the mask MK. A Xe gas with mass similar to the mass of iodine may also improve the verticality of the side wall surface of the mask MK. Thus, the iodine-containing gas may be used with or in addition to the Xe gas. The process gas may contain a $WF_6$ gas instead of or in addition to the iodine-containing gas.

In one embodiment, the halogen-containing gas in the process gas used in step STb may contain at least one gas selected from the group consisting of a $Cl_2$ gas, a $Br_2$ gas, an HCl gas, an HBr gas, an HI gas, a $BCl_3$ gas, a $C_xH_yCl_z$ gas, a $C_xF_yBr_z$ gas, a $C_xF_yI_z$ gas, a $C_xF_yCl_z$ gas, a $ClF_3$ gas, an $IF_5$ gas, an $IF_7$ gas, and a $BrF_3$ gas, where x and z are integers greater than or equal to 1, and y is an integer greater than or equal to 0.

The process gas may further contain an inert gas. The inert gas contains a nitrogen gas and at least one of various noble gases such as an Ar gas, a Kr gas, or a Xe gas.

To perform the processing in step STb, the controller 80 controls the gas supply unit to supply the process gas into the chamber 10. The controller 80 controls the gas supply unit to set the flow rate of the HF gas contained in the process gas to the flow rate described above. The controller 80 also controls the exhaust device 50 to maintain the chamber 10 at a specified gas pressure. The controller 80 also controls the plasma generator to generate plasma from the process gas. The controller 80 included in the plasma processing apparatus 1 controls the RF power supply 62 and the bias power supply 64 to provide the RF power HF, the RF power LF, or RF power HF and the electrical bias.

In one embodiment, step STb may start when the substrate support 14 (particularly, the ESC 20) is set to a temperature lower than or equal to 0, −40, or −50° C. In step STb, the temperature of the substrate support 14 (particularly, the ESC 20) may be maintained at the temperature before the start of step STb, or may be changed. At the set temperature of the substrate W, the film SF can be etched with a higher etching rate in step STb. To set the temperature of the substrate support 14, the controller 80 may control the chiller unit. When the process gas contains a phosphorus-containing gas, the substrate support 14 may be set to a temperature lower than or equal to 50, 30, or 20° C., depending on the ratio of the phosphorus-containing gas in the process gas.

In step STb, the film SF is etched with a halogen chemical species in plasma generated from the process gas. The halogen chemical species contains a fluorine chemical species generated from the HF gas. An HF molecule has a low molecular weight and thus generates a chemical species with less sputtering to the mask MK, thus causing less etching of the mask MK. With the plasma generated from the HF gas, the film SF may be etched while causing less etching of the mask MK. The plasma generated from the HF gas may also increase the etching rate of the film SF. A chemical species generated from the carbon-containing gas protects the mask MK. A carbon-containing gas containing more carbon atoms per molecule protects the mask MK more effectively. Plasma generated from a phosphorus-containing gas may reduce etching of the mask MK. With a phosphorus chemical species generated from the phosphorus-containing gas on the surface of the substrate W, the etchant is supplied more to the bottom of the recess to increase the etching rate of the film SF. The method MT thus increases the etching rate in plasma etching of the film SF and improves selectivity of the film SF to the mask MK in etching. The etching rate of the film SF further increases when the process gas contains a phosphorus-containing gas containing the halogen described above, when the process gas contains the halogen-containing gas described above, or when the process gas contains both the gases.

In step STb, the phosphorus chemical species (ions, radicals, or both) is supplied to the substrate W from the plasma generated from the phosphorus-containing gas. The phosphorus chemical species may form a protective film containing phosphorus on the surface of the substrate W. The protective film may further contain carbon, hydrogen, or both contained in the process gas. In one embodiment, the protective film may further contain oxygen contained either in the process gas or in the film SF. In one embodiment, the protective film may contain a phosphorus-oxygen bond.

Instead of or in addition to forming the protective film, the phosphorus chemical species may form a bond between an element contained in the film SF and phosphorus on the side wall surface defining the recess in the film SF. When the film SF includes a silicon oxide film, the phosphorus chemical species forms a phosphorus-oxygen bond on the side wall surface of the film SF. In step STb, the side wall surface of the film SF is inactivated (or passivated) by the phosphorus chemical species. The side wall surface of the film SF is thus passivated.

The method MT thus reduces etching of the side wall surface of the film SF (side etching). The opening in the film SF is thus less likely to be wider in the lateral direction.

For the mask MK containing carbon, the phosphorus chemical species may form a carbon-phosphorus bond on the surface of the mask MK. This carbon-phosphorus bond has higher bond energy than a carbon-carbon bond in the mask MK. The method MT thus protects the mask MK in plasma etching of the film SF.

Figure 5:
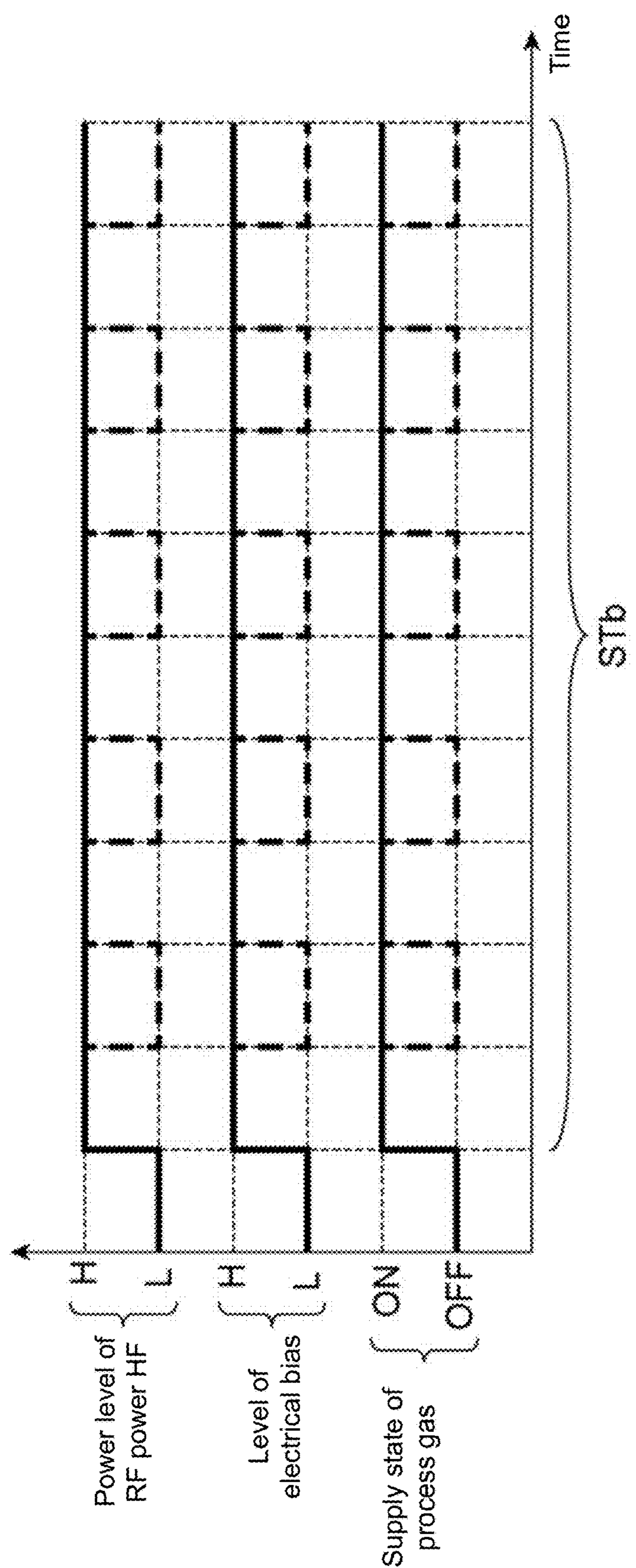
FIG. 5 is an example timing chart of the etching method according to one exemplary embodiment.

FIG. 5 will now be referred to. FIG. 5 is an example timing chart of the etching method according to one exemplary embodiment. In FIG. 5, the horizontal axis indicates time. In FIG. 5, the vertical axis indicates the power level of the RF power HF, the level of the electrical bias, and the supply state of the process gas. The RF power HF at L level indicates that the RF power HF is not being provided or is being provided at a power level lower than at the H level. The electrical bias at L level indicates that the electrical bias is not being applied to the lower electrode 18 or is being applied at a level lower than at the H level. The process gas in the ON supply state indicates that the process gas is being supplied into the chamber 10. The process gas in the OFF supply state indicates that its supply into the chamber 10 is stopped.

As indicated by a solid line in FIG. 5, the continuous-wave RF power HF may be provided in step STb in one embodiment. More specifically, the RF power HF may be supplied continuously during the period of processing in step STb. The RF power HF may be set to a power level of 2 to 10 kW inclusive.

As indicated by a solid line in FIG. 5, the continuous-wave electrical bias may be applied to the lower electrode 18 in step STb in one embodiment. The RF power LF used as an electrical bias may be set to a power level of 2 kW or more. The RF power LF may be set to a power level of 10 kW or more.

As indicated by a broken line in FIG. 5, the pulsed electrical bias described above may be applied from the bias power supply 64 to the lower electrode 18 in step STb in one embodiment. The RF power LF used as the electrical bias may be set to a power level of 2 kW or more in the periods H of the pulsed electrical bias. The RF power LF may be set to a power level of 10 kW or more in the periods H of the pulsed electrical bias.

As indicated by a broken line in FIG. 5, the pulsed-RF power HF described above may be provided in step STb in one embodiment. The RF power HF may be set to a power level of 1 to 10 kW inclusive in the periods H of the pulsed-RF power HF. As shown in FIG. 5, the periods of the pulsed-RF power HF may be synchronized with the periods of the pulsed electrical bias. As shown in FIG. 5, the periods H of the pulsed-RF power HF may be synchronized with the periods H of the pulsed electrical bias. In some embodiments, the periods H of the pulsed-RF power HF may not be synchronized with the periods H of the pulsed electrical bias. The periods H of the pulsed-RF power HF may have the same durations as or may have durations different from the periods H of the pulsed electrical bias.

As shown in FIG. 5, the process gas may be supplied and stopped alternately in step STb in one embodiment. The periods in which the process gas is supplied may or may not be synchronized with the periods H of the pulsed-RF power HF. The periods in which the process gas is supplied may or may not be synchronized with the periods H of the pulsed electrical bias.

Figure 6A:
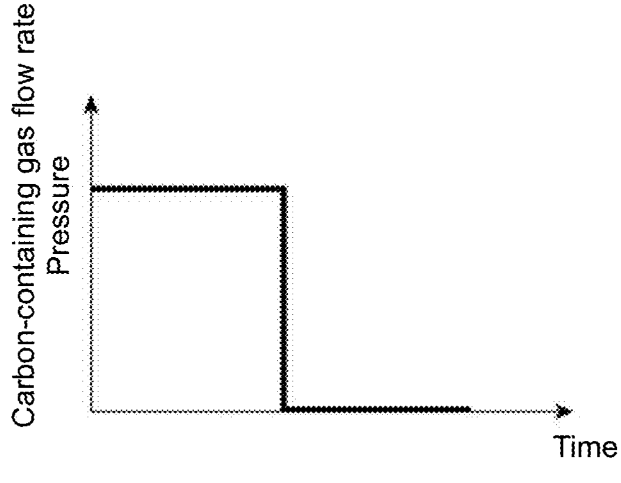
FIGS. 6A, 6B, and 6C are exemplary timing charts each showing the flow rate of a carbon-containing gas and the pressure in a chamber.
Figure 6B:
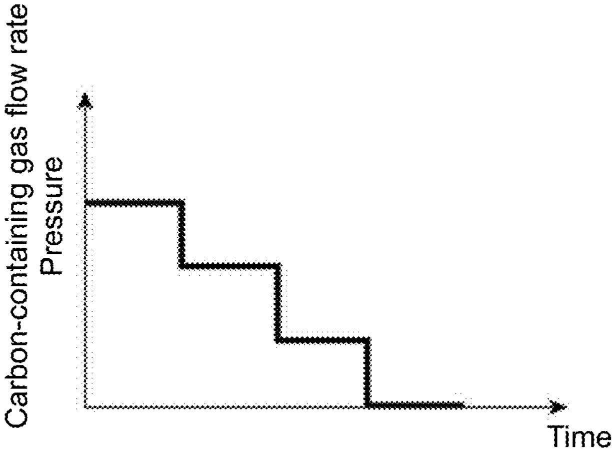
Figure 6C:
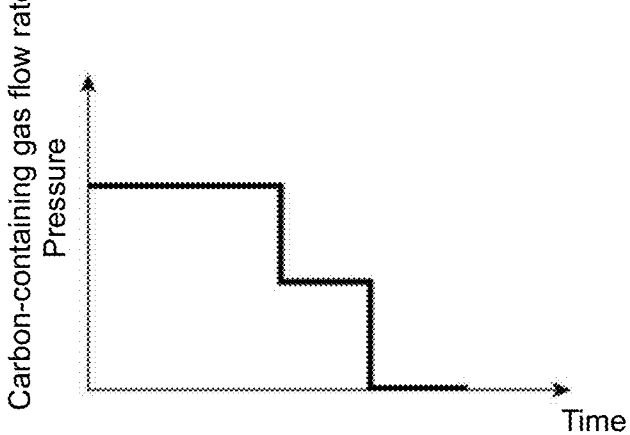
Figure 7A:
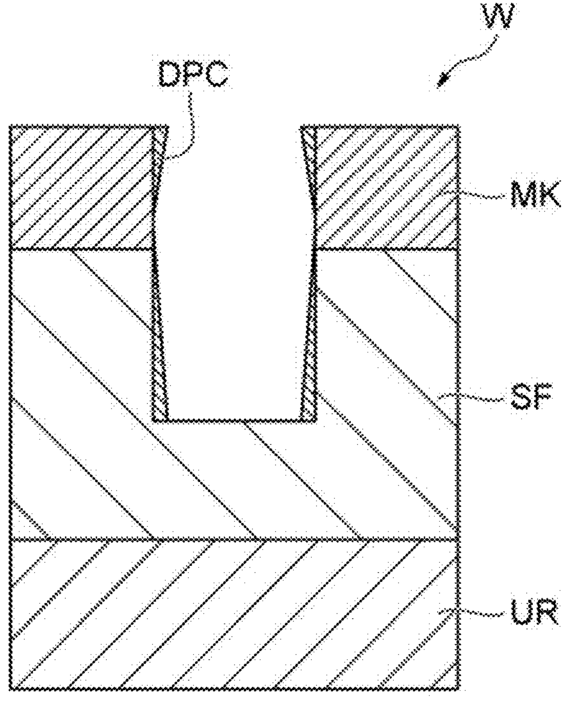
FIG. 7A is a partially enlarged cross-sectional view of an example substrate obtained with a carbon-containing gas having a higher flow rate.
Figure 7B:
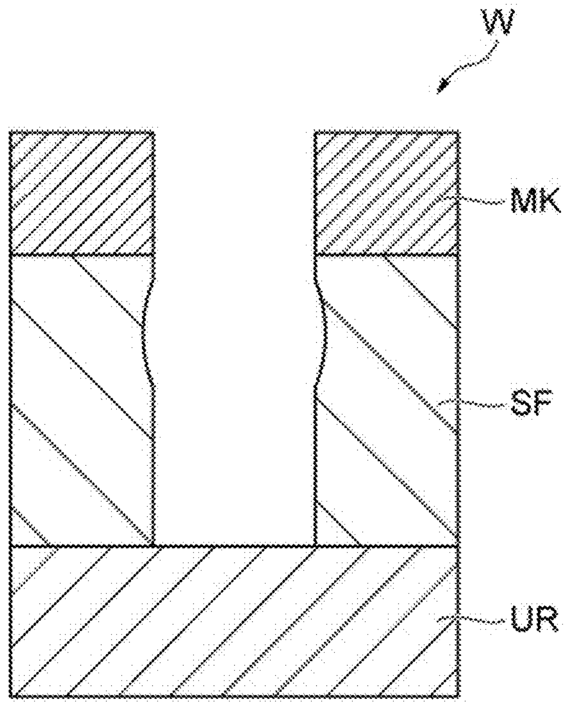
FIG. 7B is a partially enlarged cross-sectional view of an example substrate obtained with a carbon-containing gas having a lower flow rate or with no supply of a carbon-containing gas.
Figure 8A:
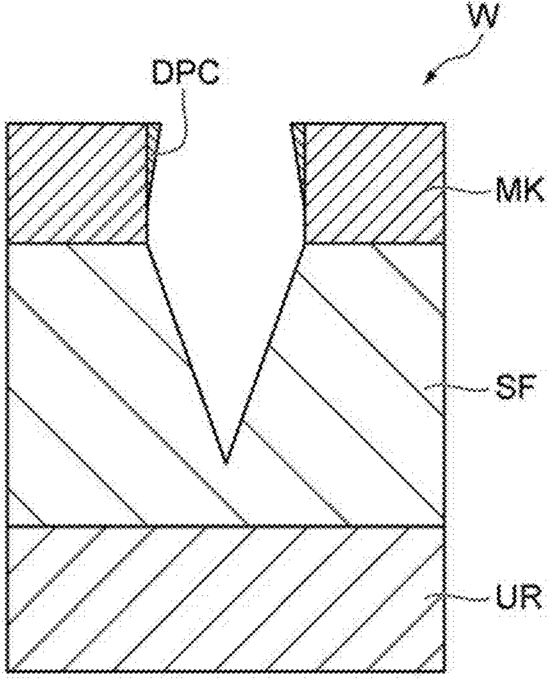
FIG. 8A is a partially enlarged cross-sectional view of an example substrate obtained with a higher pressure in the chamber.
Figure 8B:
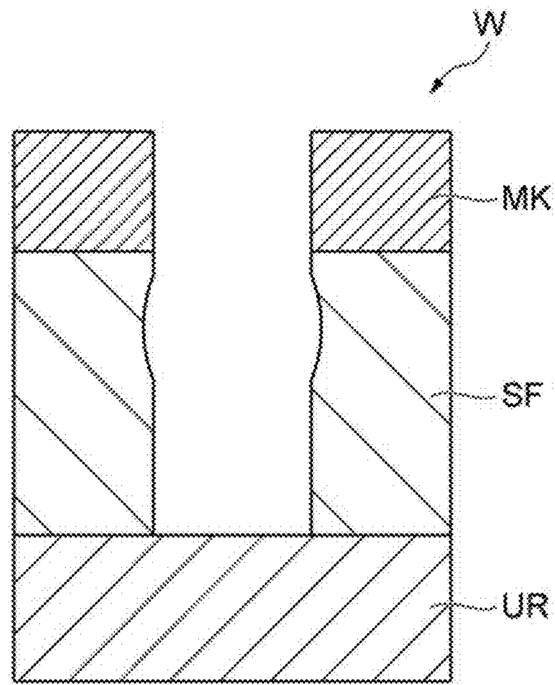
FIG. 8B is a partially enlarged cross-sectional view of an example substrate obtained with a lower pressure in the chamber.

FIGS. 6A, 6B, 6C, 7A, 7B, 8A and 8B will now be referred to. FIGS. 6A, 6B, and 6C are exemplary timing charts each showing the flow rate of a carbon-containing gas and the pressure in the chamber. FIG. 7A is a partially enlarged cross-sectional view of an example substrate obtained with a carbon-containing gas having a higher flow rate. FIG. 7B is a partially enlarged cross-sectional view of an example substrate obtained with a carbon-containing gas having a lower flow rate or with no supply of a carbon-containing gas. FIG. 8A is a partially enlarged cross-sectional view of an example substrate obtained with a higher pressure in the chamber. FIG. 8B is a partially enlarged cross-sectional view of an example substrate obtained with a lower pressure in the chamber.

As shown in FIGS. 6A, 6B, and 6C, the flow rate of the carbon-containing gas contained in the process gas, the pressure in the chamber, or both are changed in step STb in one embodiment. For example, the flow rate of the carbon-containing gas contained in the process gas, the pressure in the chamber, or both may be decreased in a stepwise manner. As shown in FIG. 6A, the flow rate of the carbon-containing gas contained in the process gas, the pressure in the chamber, or both may be decreased in a single step in step STb. As shown in FIG. 6B, the flow rate of the carbon-containing gas contained in the process gas, the pressure in the chamber, or both may be decreased over multiple steps in step STb. When the flow rate of the carbon-containing gas contained in the process gas, the pressure in the chamber, or both are decreased in a stepwise manner, respective steps may have the same duration. In some embodiments, as shown in FIG. 6C, respective steps may have different durations when the flow rate of the carbon-containing gas contained in the process gas, the pressure in the chamber, or both are decreased in a stepwise manner.

The process gas containing a carbon-containing gas at a higher flow rate increases the amount of a carbon-containing deposit DPC formed on the surface of the substrate W. This improves the selectivity of the film SF to the mask MK in etching and also reduces bowing of the side wall of the film SF as shown in FIG. 7A. However, with the process gas containing a carbon-containing gas at a higher flow rate, the recess formed in the film SF may be narrower. Thus, the opening in the mask MK may be narrower, and the recess formed in the film SF may be narrower at its bottom.

In contrast, with the process gas containing a carbon-containing gas at a lower flow rate or no carbon-containing gas, the amount of the carbon-containing deposit DPC formed on the surface of the substrate W decreases. Thus, the opening in the mask MK is wider, and the recess formed in the film SF is wider at its bottom as shown in FIG. 7B. However, the recess formed in the film SF may be partially wider due to bowing of the side wall of the film SF.

In step STb, decreasing the flow rate of the carbon-containing gas contained in the process gas in a stepwise manner reduces a decrease in the width of the opening in the mask MK and of the bottom of the recess in the film SF while maintaining the high selectivity in etching and reduction of bowing.

A higher pressure in the chamber in step STb increases the etching rate of the film SF. However, as shown in FIG. 8A, the higher pressure in the chamber in step STb may cause the recess formed in the film SF to be narrower at its bottom. The recess may thus bend.

In contrast, a lower pressure in the chamber in step STb allows ions to be supplied vertically to the substrate W, thus improving the verticality of the recess formed in the film SF as shown in FIG. 8B. However, bowing of the side wall of the film SF may occur due to a smaller amount of the carbon-containing deposit formed on the side wall of the recess.

Thus, decreasing the pressure in the chamber in a stepwise manner in step STb can reduce bowing of the side wall of the film SF and improve the verticality of the recess formed in the film SF while reducing a decrease in the etching rate of the film SF.

In one embodiment, the flow rate of the carbon-containing gas contained in the process gas may be decreased in a stepwise manner with the pressure in the chamber set within a range from 0.666 to 2.666 Pa (5 to 20 mTorr) inclusive in step STb. For example, the flow rate of the carbon-containing gas contained in the process gas may be decreased in a stepwise manner with the pressure in the chamber set to 2 Pa (15 mTorr) in step STb.

Various experiments conducted for evaluating the method MT will now be described.

First Experiment

In a first experiment, eight sample substrates, or more specifically, first to eight sample substrates, identical to the substrate W shown in FIG. 2 were prepared. The film SF was a multilayer including multiple silicon oxide films and multiple silicon nitride films stacked on one another alternately. The mask MK was formed from amorphous carbon. In the first experiment, the film SF in each of the eight sample substrates underwent plasma etching using the plasma processing apparatus 1. The plasma etching was conducted using a process gas containing a fluorocarbon gas, a hydrofluorocarbon gas, a carbon-free fluorine-containing gas, and a halogen-containing gas. The first sample substrate underwent plasma etching using a process gas containing no HF gas. The second to eighth sample substrates each underwent plasma etching using a process gas containing an HF gas having a flow rate of 34.2, 51.0, 80.0, 95.2, 98.8, 99.5, or 100 vol % of the total flow rate of the process gas. In the first experiment, the ESC 20 that receives each sample substrate was adjusted to a temperature of −50° C. or lower before the start of the plasma etching.

In the first experiment, the selectivity of the films SF to the mask MK in etching was determined based on the resultant films SF after plasma etching on the eight sample substrates. More specifically, the selectivity was determined by dividing the etching rate of the film SF by the etching rate of the mask MK based on the resultant film SF after plasma etching on each of the eight sample substrates.

Figure 9:
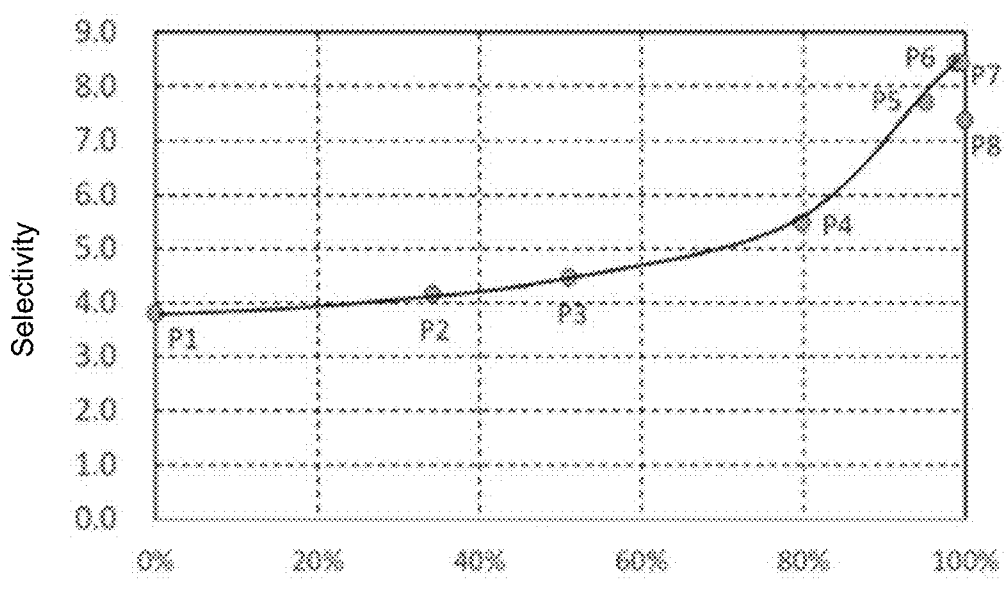
FIG. 9 is a graph showing the results of a first experiment.

The results of the first experiment are shown in the graph of FIG. 9. In the graph of FIG. 9, the horizontal axis indicates the flow rate ratio. The flow rate ratio refers to the ratio (vol %) of the flow rate of the HF gas to the total flow rate of the non-noble gas components of the process gas. In the graph of FIG. 9, the vertical axis indicates selectivity. In FIG. 9, plots P1 to P8 each indicate the selectivity determined from the resultant films SF after plasma etching on the first to the eighth sample substrates.

As shown in FIG. 9, the results of the first experiment reveal that the selectivity increases as the ratio (hereinafter referred to as the flow rate ratio) of the flow rate of the HF gas to the total flow rate of the non-noble gas components of the process gas increases. In particular, the selectivity increases more with respect to the increase of the flow rate ratio (with a steeper gradient of the approximate curve in FIG. 9) at the flow rate ratios greater than or equal to 80 vol % than at the flow rate ratios less than 80 vol %. This may be explained as follows. At the flow rate ratios less than 80 vol %, the film SF is etched at a higher etching rate for a higher flow rate ratio, thus increasing the selectivity. However, the mask is also etched by a certain degree in this range. The selectivity thus increases relatively slowly with respect to the increase in the flow rate ratio. At the flow rate ratios greater than or equal to 80 vol %, the film SF is likely to be etched at a saturated etching rate, but the mask is etched at a lower etching rate, thus increasing the selectivity. More specifically, at the flow rate ratios greater than or equal to 80 vol %, the film SF remains etched at a higher etching rate but almost no portion of the mask is etched. The selectivity thus increases at a higher rate than the flow rate ratio increases.

As shown in FIG. 9, when the HF gas has a flow rate greater than or equal to 70 vol % of the total flow rate of the non-noble gas components of the process gas, the selectivity is 5 or greater. In particular, when the HF gas has a flow rate greater than or equal to 90 vol % of the total flow rate of the non-noble gas components of the process gas, the selectivity is 7 or greater. When the flow rate ratio is greater than or equal to 95 vol %, the selectivity is 7.5 or greater.

Second Experiment

In a second experiment, three sample substrates, or more specifically, ninth to eleventh substrates, identical to the substrate used in the first experiment were prepared. In the second experiment, the film SF in each of the three sample substrates underwent plasma etching using the plasma processing apparatus 1. The plasma etching was conducted using a process gas containing an HF gas and a carbon-containing gas. For the ninth sample substrate, a process gas containing an HF gas and a $CH_2F_2$ gas was used. For the tenth sample substrate, a process gas containing an HF gas and a $C_4F_8$ gas was used. For the eleventh sample substrate, a process gas containing an HF gas and a $C_4F_6H_2$ gas was used. In the second experiment, the ESC 20 that receives each sample substrate was adjusted to a temperature of −50° C. or lower before the start of the plasma etching.

In the second experiment, the selectivity of the films SF to the mask MK in etching was determined based on the resultant films SF after plasma etching on the three sample substrates. More specifically, the selectivity was determined by dividing the etching rate of the film SF by the etching rate of the mask MK based on the resultant film SF after plasma etching on each of the three sample substrates.

Figure 10:
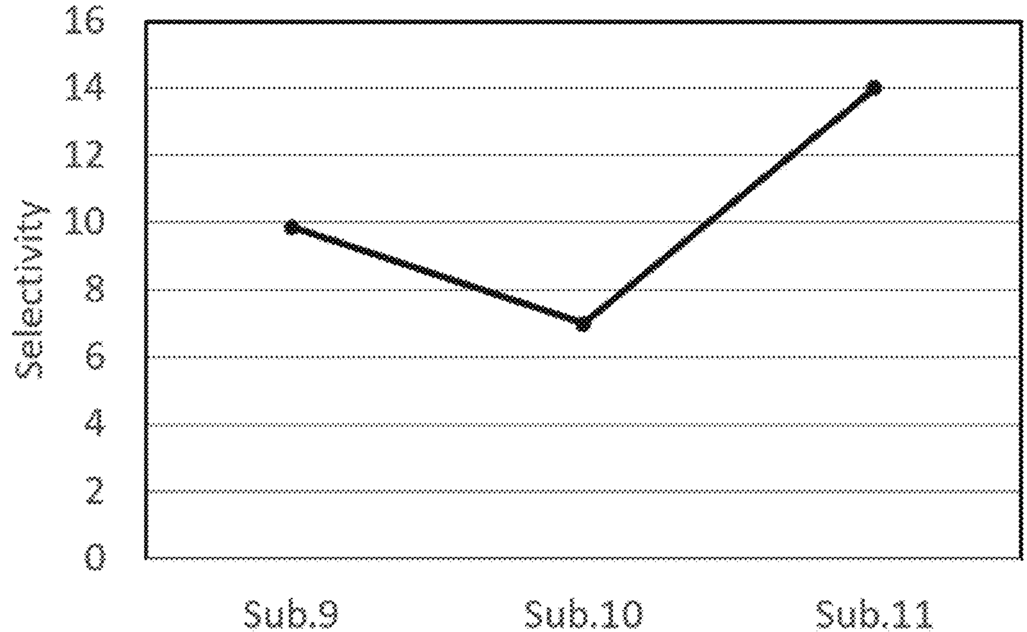
FIG. 10 is a graph showing the results of a second experiment.

The results of the second experiment are shown in the graph of FIG. 10. In the graph of FIG. 10, plots corresponding to Sub. 9 to 11 indicate selectivity determined from the resultant films SF after plasma etching on the ninth to eleventh sample substrates.

As shown in FIG. 10, the results of the second experiment reveal that the selectivity is 6 or greater for all the sample substrates. In particular, the selectivity in the eleventh sample substrate is about 14 as the highest selectivity.

Third Experiment

In a third experiment, four sample substrates, or more specifically, twelfth to fifteenth substrates, identical to the substrate used in the first experiment were prepared. In the third experiment, the film SF in each of the four sample substrates underwent plasma etching using the plasma processing apparatus 1. The plasma etching was conducted using a process gas containing an HF gas and a $C_4F_8$ gas. The process gas used for the twelfth sample substrate contained no other gas. The process gas used for the thirteenth sample substrate contained a $Cl_2$ gas at 10 sccm. The process gas used for the fourteenth sample substrate contained an HBr gas at 10 sccm. The process gas used for the fifteenth sample substrate contained a $CF_3I$ gas at 10 sccm. The pressure in the chamber was 23 mTorr (3.066 Pa) in plasma etching on the four sample substrates. The RF power HF was 40 MHz and 5.5 kW As an electrical bias, a pulsed voltage of −6 kV was applied periodically at a frequency of 400 kHz. The four sample substrates underwent plasma etching for 6 minutes. In the third experiment, the ESC 20 that receives each sample substrate was adjusted to a temperature of −70° C. before the start of the plasma etching.

In the third experiment, the width of the recess formed in the film SF was measured in a bowed portion of the side wall of the film SF. The recess in the thirteenth sample substrate is 14 nm narrower than the recess in the twelfth sample substrate. The recess in the fourteenth sample substrate is 19 nm narrower than the recess in the twelfth sample substrate. The recess in the fifteenth sample substrate is 42 nm narrower than the recess in the twelfth sample substrate. The results of the third experiment reveal that the process gas containing a halogen-containing gas such as a $Cl_2$ gas, an HBr gas, or a $CF_3I$ gas reduces bowing of the side wall of the film SF. The results also reveal that the halogen-containing gas containing iodine with relatively higher mass greatly reduces bowing of the side wall of the film SF.

Fourth Experiment

In a fourth experiment, a sixteenth sample substrate identical to the substrate used in the first experiment was prepared. In the fourth experiment, the film SF in the sixteenth sample substrate underwent plasma etching using the plasma processing apparatus 1. The plasma etching was conducted using a process gas containing an HF gas, a $C_4F_8$ gas, and a Xe gas. The pressure in the chamber was 23 mTorr (3.066 Pa) in plasma etching on the sixteenth sample substrate. The RF power HF was 40 MHz and 5.5 kW As an electrical bias, a pulsed voltage of −6 kV was applied periodically at a frequency of 400 kHz. The sixteenth sample substrate underwent plasma etching for 6 minutes. In the fourth experiment, the ESC 20 that receives each sample substrate was adjusted to a temperature of −70° C. before the start of the plasma etching.

Figure 11A:
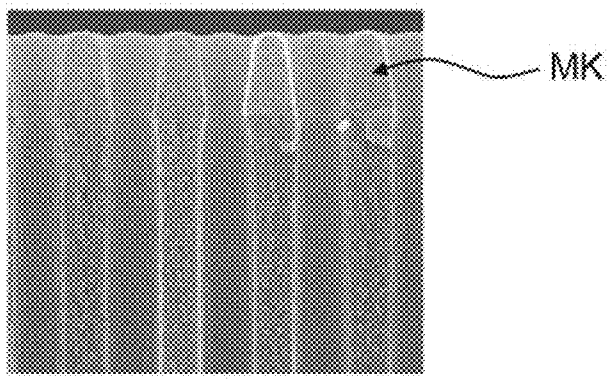
FIGS. 11A, 11B, and 11C are photographs of a twelfth sample substrate, a fifteenth sample substrate, and a sixteenth sample substrate showing their cross sections after plasma etching.
Figure 11B:
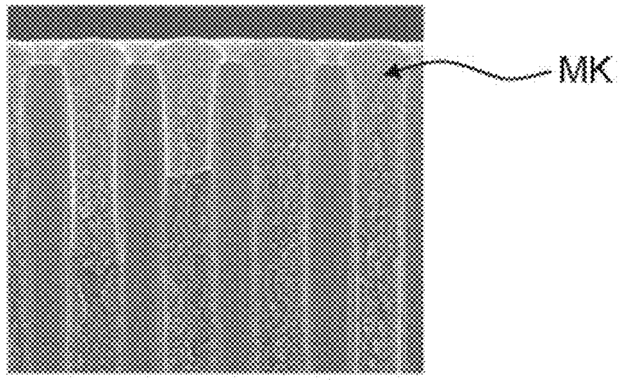
Figure 11C:
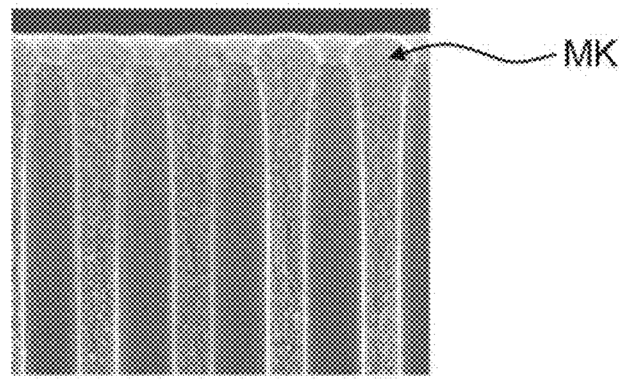

FIGS. 11A, 11B, and 11C are photographs of the twelfth sample substrate, the fifteenth sample substrate, and the sixteenth sample substrate showing their cross sections after plasma etching. As shown in FIG. 11A, the twelfth sample substrate includes a mask MK having a tapered side surface. As shown in FIG. 11B, the fifteenth sample substrate etched using a process gas containing a $CF_3I$ gas includes a mask MK having high verticality on its side surface. As shown in FIG. 11C, the sixteenth sample substrate etched using a process gas containing a Xe gas includes a mask MK having a highly vertical side surface. As shown in FIGS. 11B and 11C, due to the similarity in mass between Xe and iodine, the fifteenth sample substrate and the sixteenth sample substrate have similar cross-sectional profiles. This reveals that bowing of the side wall of the film SF can be reduced by using a gas containing an element having relatively higher mass, such as iodine, Xe, or both.

Fifth Experiment and Sixth Experiment

Figure 12A:
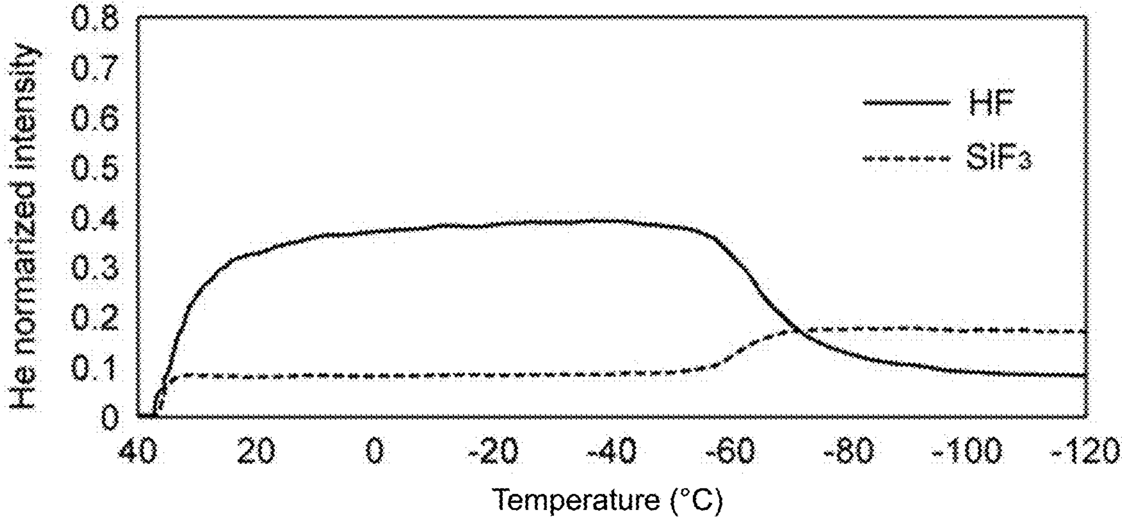
FIG. 12A is a graph showing the results of a fifth experiment.
Figure 12B:
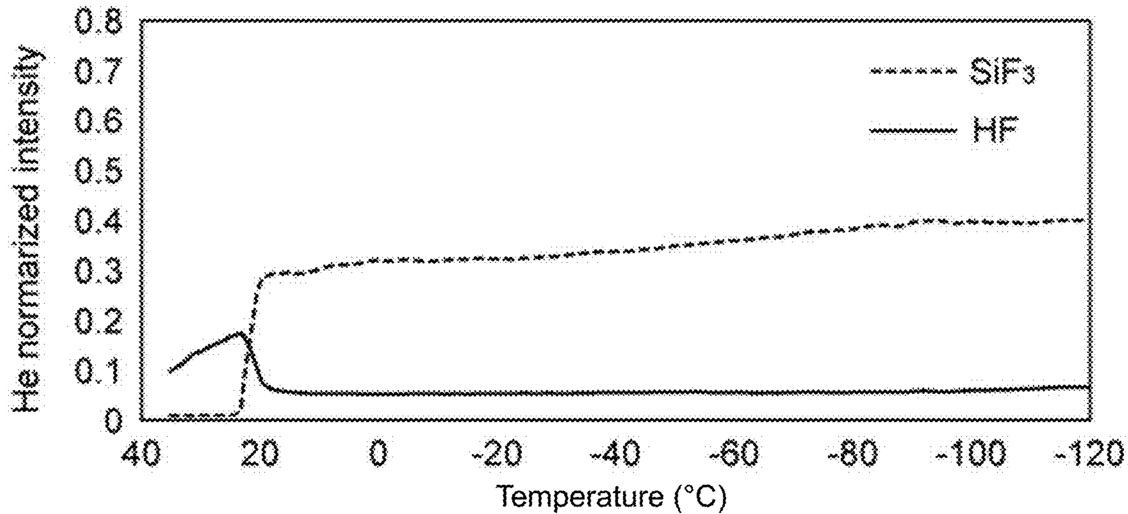
FIG. 12B is a graph showing the results of a sixth experiment.

In a fifth experiment, a silicon oxide film was etched with plasma generated from a process gas, which is a mixture of an HF gas and an argon gas, using the plasma processing apparatus 1. In a sixth experiment, a silicon oxide film was etched with plasma generated from a process gas, which is a mixture of an HF gas, an argon gas, and a $PF_3$ gas, using the plasma processing apparatus 1. In the fifth and sixth experiments, the silicon oxide films were etched at varying temperatures of the ESC 20. In the fifth and sixth experiments, the amounts of HF and $SiF_3$ in the gas phase during the etching of the silicon oxide film were measured using a quadrupole mass spectrometer. FIGS. 12A and 12B show the results of the fifth and sixth experiments. FIG. 12A shows the relationship between the temperature of the ESC 20 and the amounts of HF and $SiF_3$ during the etching of the silicon oxide film in the fifth experiment. FIG. 12B shows the relationship between the temperature of the ESC 20 and the amounts of HF and $SiF_3$ during the etching of the silicon oxide film in the sixth experiment.

As shown in FIG. 12A, when the temperature of the ESC 20 is about −60° C. or lower, the amount of HF, which is an etchant, decreases, and the amount of $SiF_3$, which is a reaction product through the etching of the silicon oxide film, increases in the fifth experiment. More specifically, when the temperature of the ESC 20 is about −60° C. or lower, the amount of etchant used in the silicon oxide film etching increases in the fifth experiment. In contrast, when the temperature of the ESC 20 is 20° C. or lower, the amount of HF decreases, and the amount of $SiF_3$ increases in the sixth experiment as shown in FIG. 12B. More specifically, when the temperature of the ESC 20 is 20° C. or lower, the amount of etchant used in the silicon oxide film etching increases in the sixth experiment. The process gas used in the sixth experiment differs from the process gas used in the fifth experiment in containing a $PF_3$ gas. In the sixth experiment, a phosphorus chemical species was on the surface of the silicon oxide film during etching. This reveals that, with a phosphorus chemical species on the surface of the substrate, the etchant is supplied more to the bottom of the recess to increase the etching rate of the silicon-containing film.

Seventh Experiment

In a seventh experiment, multiple sample substrates identical to the substrate prepared in the first experiment were prepared. In the seventh experiment, the film SF in each of the multiple sample substrates was etched with plasma generated from a process gas using the plasma processing apparatus 1. The process gas containing an HF gas and a fluorocarbon gas was used in the seventh experiment. For each of the multiple sample substrates, a process gas containing a $PF_3$ gas with a different flow rate proportion was used in the seventh experiment. The flow rate proportion of the $PF_3$ gas refers to the proportion of the flow rate of the $PF_3$ gas to the flow rate of the process gas. The pressure in the chamber was 27 mTorr (3.6 Pa) in plasma etching in the seventh experiment. The RF power HF was 40 MHz and 4.4 kW. As an electrical bias, RF bias power of 400 kHz and 6 kW was also supplied. The duration of plasma etching in the seventh experiment was 6 minutes. In the seventh experiment, the ESC 20 that receives each sample substrate was adjusted to a temperature of −40° C. before the start of the plasma etching.

Figure 13:
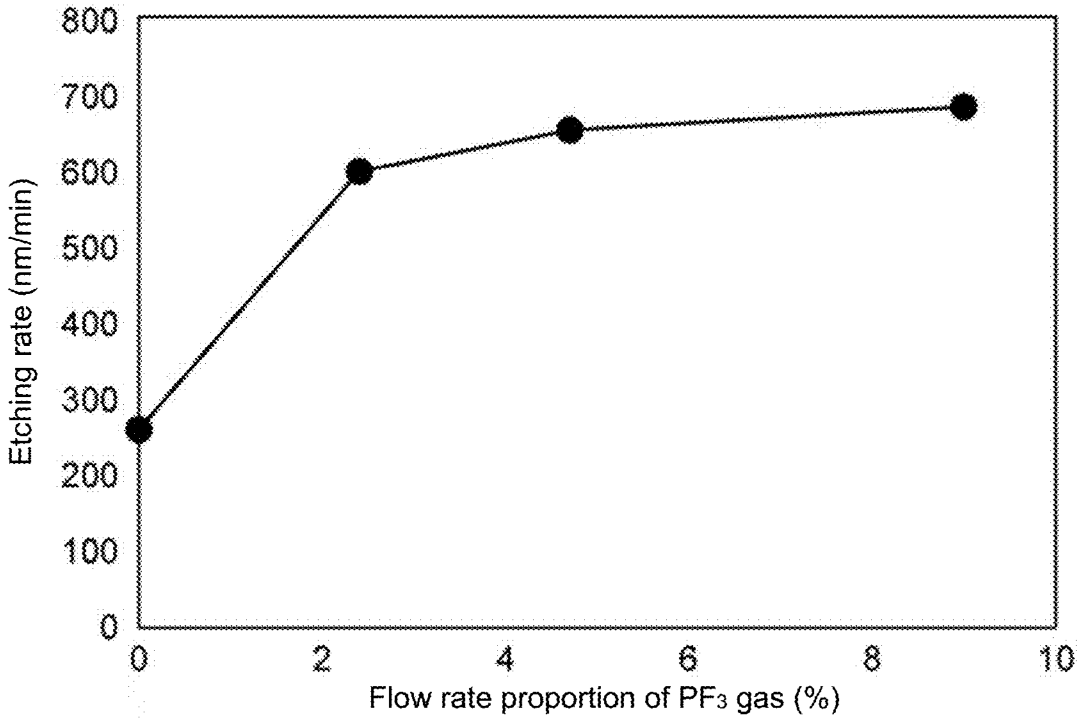
FIG. 13 is a graph showing the results of a seventh experiment.

In the seventh experiment, the etching rates of the films SF were determined based on the resultant film SF after etching on each of the multiple sample substrates. The relationship between the flow rate proportion of the $PF_3$ gas and the etching rate of the film SF was then obtained. FIG. 13 shows the results. As shown in FIG. 13, when the flow rate proportion of the $PF_3$ gas to the flow rate of the process gas is 2% or higher (or 2.5% or higher), higher etching rates are obtained. More specifically, when the flow rate of the phosphorus-containing gas is 2% or higher (or 2.5% or higher) to the flow rate of the process gas containing an HF gas, a $C_4F_8$ gas, and a phosphorus-containing gas ($PF_3$ gas), higher etching rates are obtained.

Eighth to Eleventh Experiments

In an eighth experiment and in a ninth experiment, multiple substrates each including a silicon oxide film were prepared. In the eighth and ninth experiments, the silicon oxide film in each of the multiple sample substrates was etched with plasma generated from a process gas using the plasma processing apparatus 1. In the eighth and ninth experiments, the silicon oxide films in the multiple sample substrates were each etched on the substrate support 14 at different temperatures. In a tenth experiment and in an eleventh experiment, multiple substrates each including a silicon nitride film were prepared. In the tenth and eleventh experiments, the silicon nitride film in each of the multiple sample substrates was etched with plasma generated from a process gas using the plasma processing apparatus 1. In the tenth and eleventh experiments, the silicon nitride films in the multiple sample substrates were each etched on the substrate support 14 at different temperatures. A process gas containing an HF gas and a $C_4F_8$ gas was used in the eighth to eleventh experiments. The flow rate proportion of the $PF_3$ gas to the flow rate of the process gas was 2.5% in the eighth and tenth experiments. The process gas used in the ninth and eleventh experiments contained no $PF_3$ gas. The other conditions in the eighth to eleventh experiments were the same as the corresponding conditions described above in the seventh experiment.

Figure 14:
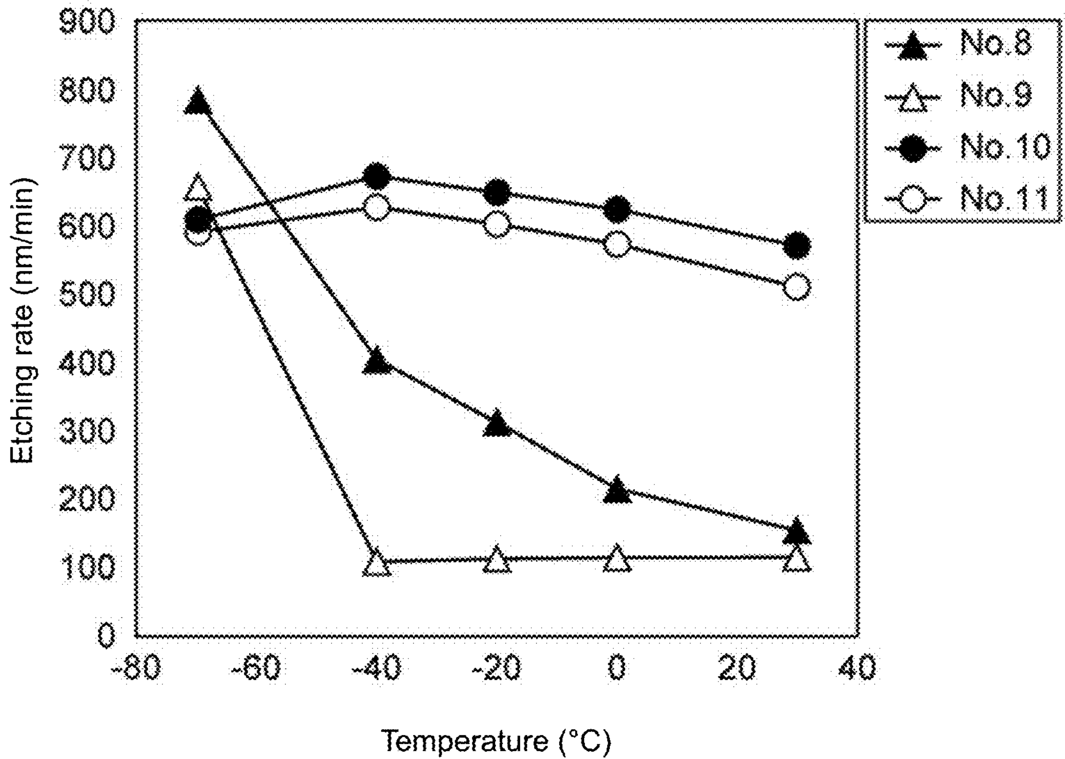
FIG. 14 is a graph showing the results of eighth to eleventh experiments.

In the eighth and ninth experiments, the etching rates of the silicon oxide films were determined based on the etching result for each silicon oxide film in the multiple sample substrates. In the tenth and eleventh experiments, the etching rates of the silicon nitride films were determined based on the etching result for each silicon nitride film in the multiple sample substrates. FIG. 14 shows the relationship between the temperatures of the substrate support 14 set in the eighth to eleventh experiments and the determined etching rates. In FIG. 14, the lines of Nos. 8, 9, 10, and 11 respectively indicate the results of the eighth to eleventh experiments. As shown in FIG. 14, the etching rate of the silicon oxide film is higher in the eighth experiment using a process gas containing a $PF_3$ gas than in the ninth experiment using a process gas containing no $PF_3$ gas. The results of the eighth experiment also reveal that the substrate support 14 set at a temperature of 0° C. or lower further increases the etching rate of the silicon oxide film when the process gas containing a $PF_3$ gas is used.

Twelfth Experiment and Thirteenth Experiment

Figure 15:
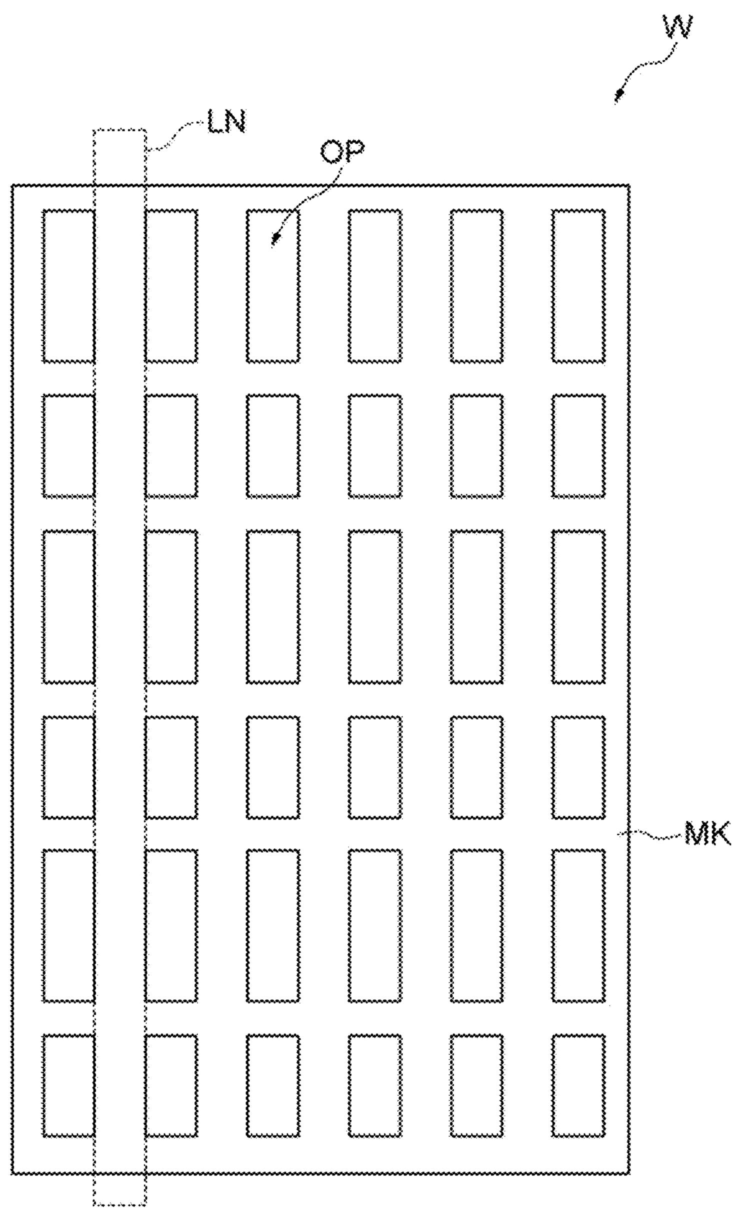
FIG. 15 is a plan view of a sample substrate used in a twelfth experiment and in a thirteenth experiment.

In a twelfth experiment and in a thirteenth experiment, the film SF in each sample substrate was etched with plasma generated from a process gas using the plasma processing apparatus 1. FIG. 15 is a plan view of the sample substrate used in the twelfth and thirteenth experiments. In the sample substrate, the film SF included a stack including a silicon oxide film, a polycrystalline silicon film, and a silicon nitride film. The mask MK was formed from amorphous carbon. As shown in FIG. 15, multiple openings OP were defined in the mask MK. As shown in FIG. 15, the multiple openings OP each had a planar rectangular shape. As shown in FIG. 15, the multiple openings OP were arranged two-dimensionally in rows and columns.

In the twelfth experiment, the process gas was a mixture of an $H_2$ gas, a $Cl_2$ gas, an HBr gas, a fluorocarbon gas, a hydrofluorocarbon gas, and an $NF_3$ gas. The pressure in the chamber was 15 mTorr (2 Pa) in plasma etching in the twelfth experiment. The RF power HF was 40 MHz and 5.5 kW As an electrical bias, RF bias power of 400 kHz and 7 kW was also supplied. The duration of plasma etching in the twelfth experiment was 1350 seconds. In the twelfth experiment, the ESC 20 that receives each sample substrate was adjusted to a temperature of −35° C. before the start of the plasma etching.

In the thirteenth experiment, the process gas was a mixture of an HF gas, a $PF_3$ gas, an $NF_3$ gas, a $Cl_2$ gas, an HBr gas, a $C_4F_8$ gas, and a $CH_2F_2$ gas. The pressure in the chamber was 25 mTorr (3.066 Pa) in plasma etching in the thirteenth experiment. The RF power HF was 40 MHz and 5.5 kW As an electrical bias, a pulsed voltage of −6 kV was applied periodically at a frequency of 400 kHz. The duration of plasma etching in the thirteenth experiment was 420 seconds. In the thirteenth experiment, the ESC 20 that receives each sample substrate was adjusted to a temperature of −70° C. before the start of the plasma etching.

In the twelfth and thirteenth experiments, the etching rates of the films SF and the selectivity of the films SF to the mask MK in etching were determined. The etching rate of the film SF in the thirteenth experiment was about 3 times the etching rate of the film SF in the twelfth experiment. The selectivity in the thirteenth experiment was about 2.5 times the selectivity in the twelfth experiment. This reveals that the process gas used in step STb included in the method MT increases the etching rate of the film SF and the selectivity of the film SF to the mask MK in etching.

In the twelfth and thirteenth experiments, the line edge roughness (LER) of a line LN on the mask MK shown in FIG. 15 was determined. The LER in the twelfth experiment was 26.5 nm. The LER in the thirteenth experiment was 16.8 nm. This reveals that the process gas used in step STb in the method MT may reduce degradation of the shape of the mask MK.

Fourteenth to Eighteenth Experiments

In fourteenth to eighteenth experiments, the film SF in each sample substrate was etched with plasma generated from a process gas using the plasma processing apparatus 1. The sample substrate used in each of the fourteenth to eighteenth experiments was identical to the sample substrate prepared in the first experiment. The plasma etching was conducted using a process gas containing an HF gas. In the fourteenth and the sixteenth to eighteenth experiments, the process gas further contained a C4F8 gas as a carbon-containing gas. In the fifteenth experiment, the process gas contained no carbon-containing gas. In the sixteenth experiment, the flow rate of the carbon-containing gas was decreased to 0 sccm in two steps during a period between the start and the end of plasma etching. In the seventeenth experiment, the flow rate of the carbon-containing gas was decreased to 0 sccm in three steps during a period between the start and the end of plasma etching. In the eighteenth experiment, the flow rate of the carbon-containing gas was decreased to 0 sccm in five steps during a period between the start and the end of plasma etching. The pressure in the chamber was 23 mTorr (3.066 Pa) in plasma etching in the fourteenth to eighteenth experiments. The RF power HF was 40 MHz and 5.5 kW As an electrical bias, a pulsed voltage of −6 kV was applied periodically at a frequency of 400 kHz. In the fourteenth to eighteenth experiments, the ESC 20 that receives each sample substrate was adjusted to a temperature of −70° C. before the start of the plasma etching.

Figure 16:
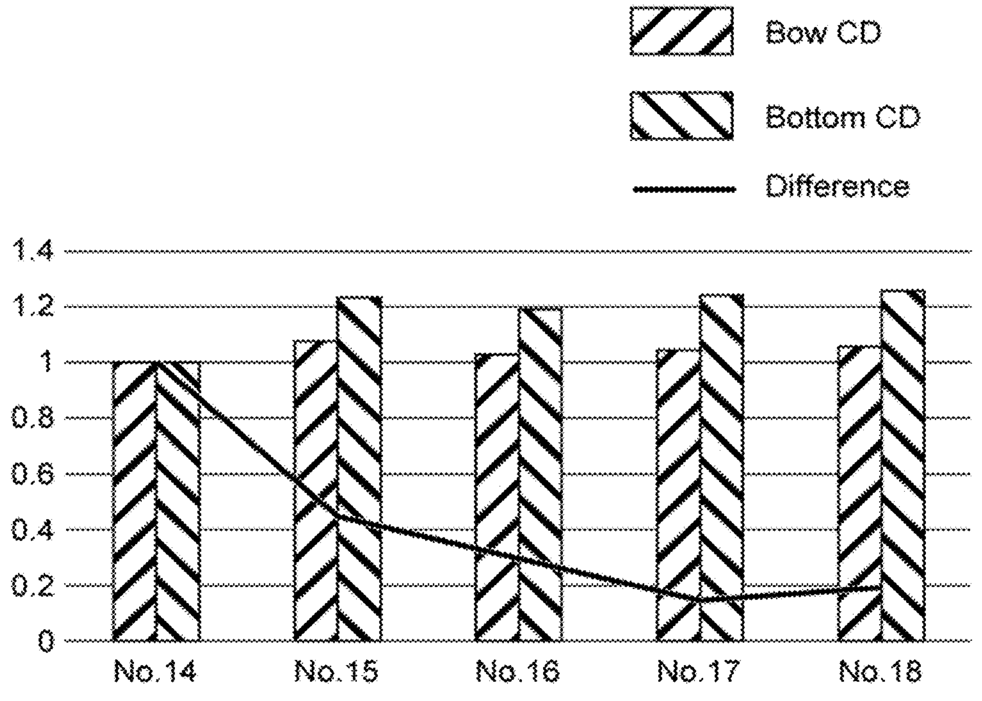
FIG. 16 is a graph showing the results of fourteenth to eighteenth experiments.

For the recess formed in the film SF in each of the fourteenth to eighteenth experiments, the width at the bottom (bottom CD) and the width in a bowed portion (bow CD) of the side wall of the film SF were determined. The difference between the bottom CD and the bow CD was also determined. FIG. 16 shows the results of the fourteenth to eighteenth experiments. In FIG. 16, bars and plots corresponding to Nos. 14, 15, 16, 17, and 18 respectively indicate the results of the fourteenth to eighteenth experiments. FIG. 16 shows a normalized value of the bottom CD determined in each experiment with respect to the value of the bottom CD determined in the fourteenth experiment. FIG. 16 also shows a normalized value of the bow CD determined in each experiment with respect to the bow CD determined in the fourteenth experiment. FIG. 16 also shows a normalized value of the difference determined in each experiment with respect to the value of the difference determined in the fourteenth experiment.

In the fifteenth experiment with the process gas containing no carbon-containing gas, the bottom CD is greater than the bottom CD in the fourteenth experiment. However, the bow CD is also greater than the bow CD in the fourteenth experiment. In each of the sixteenth to eighteenth experiments, the bow CD is greater than the bow CD in the fourteenth experiment by a smaller increase. The bottom CD is also greater than the bottom CD in the fourteenth experiment. The difference in each of the sixteenth to eighteenth experiments is much smaller than the difference in the fourteenth experiment. This reveals that decreasing the flow rate of the carbon-containing gas in the process gas in a stepwise manner during plasma etching can improve the verticality of the recess while reducing the bow CD.

Nineteenth Experiment

In a nineteenth experiment, the film SF in a sample substrate identical to the sample substrate in the seventeenth experiment underwent plasma etching. The plasma etching in the nineteenth experiment differs from the plasma etching in the seventeenth experiment in that the pressure in the chamber was 15 mTorr (2 Pa). In the nineteenth experiment, the bow CD was greater than the bow CD in the fourteenth experiment by a smaller increase, and the bottom CD was about 1.4 times greater than the bottom CD in the fourteenth experiment. Thus, setting the pressure in the chamber to a relatively low pressure in addition to decreasing the flow rate of the carbon-containing gas contained in the process gas in a stepwise manner can further improve the verticality of the recess as well as reducing the bow CD.

Twentieth Experiment and Twenty-First Experiment

In a twentieth experiment and in a twenty-first experiment, the film SF in a sample substrate identical to the sample substrate in the first experiment underwent plasma etching using the plasma processing apparatus 1. In the twentieth experiment, the plasma etching was conducted using a process gas of a mixture of an $H_2$ gas, a hydrofluorocarbon gas, a fluorocarbon gas, a fluorine-containing gas, and a halogen-containing gas. In the twenty-first experiment, the plasma etching was conducted with a process gas of a mixture of an HF gas, a $C_4F_8$ gas, and an $O_2$ gas. The pressure in the chamber was 27 mTorr (3.6 Pa) during the plasma etching in the twentieth and twenty-first experiments. The RF power HF was 40 MHz and 4.4 kW As an electrical bias, RF bias power of 400 kHz and −6 kV was used. In the twentieth and twenty-first experiments, the ESC 20 that receives each sample substrate was adjusted to a temperature of −40° C. before the start of the plasma etching.

In the twentieth and twenty-first experiments, the etching rates of the films SF and the selectivity of the films SF to the mask MK in etching were determined. The etching rate of the film SF was 310 nm/min in the twentieth experiment. The etching rate of the film SF was 296 nm/min in the twenty-first experiment. The selectivity was 3.24 in the twentieth experiment. The selectivity was 6.52 in the twenty-first experiment. The results of the twentieth and twenty-first experiments reveal that adding an HF gas to the process gas decreases the etching rate of the mask MK and thus improves selectivity.

Although the exemplary embodiments have been described above, the embodiments are not restrictive, and various additions, omissions, substitutions, and changes may be made. The components in the different embodiments may be combined to form another embodiment.

The plasma processing apparatus using the method MT may be a capacitively coupled plasma processing apparatus other than the plasma processing apparatus 1. The plasma processing apparatus using the method MT may be an inductively coupled plasma processing apparatus, an electron cyclotron resonance (ECR) plasma processing apparatus, or a plasma processing apparatus that generates plasma using surface waves such as microwaves.

The plasma processing apparatus may include, in addition to the bias power supply 64 that provides the RF power LF to the lower electrode 18, another bias power supply that intermittently or periodically applies a pulsed voltage to the lower electrode 18.

The above embodiments further include the aspects described below.

(A1). A process gas for plasma etching of a silicon oxide film, the process gas comprising:

a hydrogen fluoride gas;

a phosphorus-containing gas; and a carbon-containing gas.

(A2). The process gas according to A1, wherein the hydrogen fluoride gas has a highest flow rate of the hydrogen fluoride gas, the phosphorus-containing gas, and the carbon-containing gas.

(B1). An etching method, comprising:

(a) providing a substrate in a chamber in a plasma processing apparatus, the substrate including a silicon-containing film; and (b) etching the silicon-containing film with a chemical species in plasma generated from a process gas in the chamber, wherein the process gas contains a phosphorus-containing gas, a fluorine-containing gas, a hydrofluorocarbon gas, and a halogen-containing gas containing a non-fluorine halogen.

(B2). The etching method according to B1, wherein the fluorine-containing gas contains at least one gas selected from the group consisting of a fluorocarbon gas and a carbon-free fluorine-containing gas.

(B3). The etching method according to B2, wherein the carbon-free fluorine-containing gas is a nitrogen trifluoride gas or a sulfur hexafluoride gas.

(B4). The etching method according to any one of B1 to B3, wherein the halogen-containing gas is at least one of a $Cl_2$ gas or an HBr gas.

(C1). An etching method, comprising:

(a) providing a substrate in a chamber in a plasma processing apparatus, the substrate including a mask and a silicon-containing film on the mask; and (b) etching the silicon-containing film with a chemical species in plasma generated from a process gas in the chamber, wherein the process gas contains a hydrogen fluoride gas and a carbon-containing gas, and the hydrogen fluoride gas has a highest flow rate of all gases in the process gas containing no noble gas or of all non-noble gas components of the process gas.

(C2). The etching method according to C1, wherein the process gas further contains a phosphorus-containing gas.

(C3). The etching method according to C1, wherein the process gas further contains an amine gas.

(C4). The etching method according to any one of C1 to C3, wherein the carbon-containing gas contains at least one of a fluorocarbon or a hydrofluorocarbon having one to six carbon atoms per molecule.

(C5). The etching method according to any one of C1 to C4, wherein (b) includes decreasing a flow rate of the carbon-containing gas in a stepwise manner.

(C6). The etching method according to C5, wherein (b) includes setting a pressure in the chamber to 0.666 to 2.666 Pa inclusive.

(C7). An etching method, comprising:

(a) providing a substrate in a chamber in a plasma processing apparatus, the substrate including a silicon-containing film and a mask on the silicon-containing film; and (b) etching the silicon-containing film with a chemical species in plasma generated from a process gas in the chamber, wherein the process gas contains a hydrogen fluoride gas and further contains a phosphorus-containing gas or an amine gas, and the hydrogen fluoride gas has a highest flow rate of all gases in the process gas containing no noble gas or of all non-noble gas components of the process gas.

(C8). The etching method according to any one of C1 to C7, wherein the process gas further contains at least one gas selected from the group consisting of an $NF_3$ gas, an $O_2$ gas, a $CO_2$ gas, a CO gas, an $N_2$ gas, a He gas, an Ar gas, a Kr gas, and a Xe gas.

(C9). The etching method according to any one of C1 to C8, wherein the process gas further contains a halogen-containing gas.

(C10). The etching method according to C9, wherein the halogen-containing gas contains at least one gas selected from the group consisting of a $Cl_2$ gas, a $Br_2$ gas, an HCl gas, an HBr gas, an HI gas, a $BCl_3$ gas, a $CH_xCl_y$ gas, a $CF_xBr_y$ gas, a $CF_xI_y$ gas, a $ClF_3$ gas, an $IF_5$ gas, an $IF_7$ gas, and a $BrF_3$ gas, where x and y are integers greater than or equal to 1.

(C11). The etching method according to any one of C1 to C10, wherein the process gas further contains an iodine-containing gas.

(C12). The etching method according to C11, wherein the iodine-containing gas contains at least one selected from the group consisting of HI, $IF_t$, and $C_xF_yI_z$, where t, x, y, and z are integers greater than or equal to 1.

(C13). The etching method according to any one of C1 to C12, wherein (b) includes decreasing a pressure in the chamber in a stepwise manner.

(C14). The etching method according to any one of C1 to C13, wherein the silicon-containing film includes at least one of a silicon oxide film or a silicon nitride film.

(C15). The etching method according to C14, wherein the silicon-containing film further includes a polycrystalline silicon film.

(C16). The etching method according to any one of C1 to C15, wherein the mask is a carbon-containing mask.

The exemplary embodiments according to the present disclosure have been described by way of example, and various changes may be made without departing from the scope and spirit of the present disclosure. The exemplary embodiments disclosed above are thus not restrictive, and the true scope and spirit of the present disclosure are defined by the appended claims.

REFERENCE SIGNS LIST

1 Plasma processing apparatus
10 Chamber
14 Substrate support
80 Controller
W Substrate
SF Film

The invention claimed is:

1. A method of etching a substrate in a chamber of a plasma processing apparatus, the substrate including a silicon-containing film and a mask on the silicon-containing film, the method comprising:

(a) providing a process gas to the chamber; and (b) etching the silicon-containing film with a chemical species in a plasma generated from the process gas, wherein the process gas contains a hydrogen fluoride gas and a phosphorus-containing gas, wherein the hydrogen fluoride gas has a highest flow rate of all gases in the process gas containing no noble gas or of all non-noble gas components of the process gas, the silicon-containing film is an alternate stack of multiple silicon oxide films and multiple silicon nitride films or an alternate stack of multiple silicon oxide films and multiple silicon films, and step (b) includes etching the layer of the alternate stack that is in contact with the mask.

2. The method according to claim 1, wherein the process gas further contains a halogen-containing gas.

3. The method according to claim 2, wherein the halogen-containing gas contains a CxFyBrz gas, where x and z are integers greater than or equal to 1, and y is an integer greater than or equal to 0.

4. The method according to claim 2, wherein the halogen-containing gas contains $ClF_3$ gas.

5. The method according to claim 2, wherein the halogen-containing gas contains at least one gas selected from the group consisting of a $Cl_2$ gas, a $Br_2$ gas, an HCl gas, an HBr gas, an HI gas, a $BCl_3$ gas, a CxHyClz gas, a CxFyBrz gas, a CxFyIz gas, a CxFyClz gas, a $ClF_3$ gas, an $IF_5$ gas, an $IF_7$ gas, and a $BrF_3$ gas, where x and z are integers greater than or equal to 1, and y is an integer greater than or equal to 0.

6. The method according to claim 2, wherein the halogen-containing gas contains carbon.

7. The method according to claim 6, wherein the halogen-containing gas contains two or more halogens.

8. The method according to claim 2, wherein the halogen-containing gas contains at least one selected from the group consisting of a $CHCl_3$ gas, a $CH_2Cl_2$ gas, a $CF_2Br_2$ gas, and a CxFyClz gas, where x and z are integers greater than or equal to 1, and y is an integer greater than or equal to 0.

9. The method according to claim 1, wherein the process gas further contains a carbon-containing gas.

10. The method according to claim 9, wherein the carbon-containing gas contains at least one of a fluorocarbon or a hydrofluorocarbon having one to six carbon atoms per molecule.

11. The method according to claim 1, wherein the process gas further contains at least one gas selected from the group consisting of an $NF_3$ gas, an $O_2$ gas, a $CO_2$ gas, a CO gas, an $N_2$ gas, a He gas, an Ar gas, a Kr gas, and a Xe gas.

12. The method according to claim 1, wherein the silicon-containing film further includes a polycrystalline silicon film.

13. The method according to claim 1, wherein the substrate includes a carbon-containing mask or a metal-containing mask on the silicon-containing film.

14. The method according to claim 1, wherein the substrate includes a mask comprising at least one metal-containing material selected from the group consisting of titanium nitride, titanium oxide, tungsten, and tungsten carbide on the silicon-containing film.

15. A method of etching a substrate in a chamber of a plasma processing apparatus, the substrate including a silicon-containing film and a mask on the silicon-containing film, the method comprising:

(a) providing a process gas to the chamber; and (b) etching the silicon-containing film with a chemical species in a plasma generated from the process gas, wherein the process gas contains a hydrogen fluoride gas and a phosphorus-containing gas, wherein the process gas further contains a carbon-containing gas, and wherein the etching the silicon-containing film includes decreasing a flow rate of the carbon-containing gas in a stepwise manner.

16. The method according to claim 15, wherein the etching the silicon-containing film includes setting a pressure in the chamber to 0.666 to 2.666 Pa inclusive.

17. A method of etching a substrate in a chamber of a plasma processing apparatus, the substrate including a silicon-containing film and a mask on the silicon-containing film, the method comprising:

(a) providing a process gas to the chamber; and (b) etching the silicon-containing film with a chemical species in a plasma generated from the process gas, wherein the process gas contains a hydrogen fluoride gas and a phosphorus-containing gas, and wherein the etching the silicon-containing film includes decreasing a pressure in the chamber in a stepwise manner.

* * * * *